United States Patent
Shimakawa et al.

(10) Patent No.: US 8,953,363 B2
(45) Date of Patent: Feb. 10, 2015

(54) NONVOLATILE SEMICONDUCTOR MEMORY DEVICE AND READ METHOD FOR THE SAME

(75) Inventors: Kazuhiko Shimakawa, Osaka (JP); Kiyotaka Tsuji, Osaka (JP); Ryotaro Azuma, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 291 days.

(21) Appl. No.: 13/700,329

(22) PCT Filed: Jul. 11, 2012

(86) PCT No.: PCT/JP2012/004493
§ 371 (c)(1),
(2), (4) Date: Nov. 27, 2012

(87) PCT Pub. No.: WO2013/011669
PCT Pub. Date: Jan. 24, 2013

(65) Prior Publication Data
US 2013/0148406 A1    Jun. 13, 2013

(30) Foreign Application Priority Data
Jul. 21, 2011    (JP) ................................. 2011-160378

(51) Int. Cl.
| | |
|---|---|
| G11C 11/00 | (2006.01) |
| G11C 13/00 | (2006.01) |
| G11C 11/16 | (2006.01) |
| G11C 7/14 | (2006.01) |

(52) U.S. Cl.
CPC ............. *G11C 13/004* (2013.01); *G11C 7/14* (2013.01); *G11C 11/1673* (2013.01);
(Continued)

(58) Field of Classification Search
CPC ............................... G11C 13/004; G11C 7/14
USPC ..................................... 365/148, 175, 210.1
See application file for complete search history.

(56) References Cited

U.S. PATENT DOCUMENTS

| | | | |
|---|---|---|---|
| 6,678,187 B2 | 1/2004 | Honda et al. | |
| 6,885,579 B2 * | 4/2005 | Sakimura et al. | ............. 365/158 |

(Continued)

FOREIGN PATENT DOCUMENTS

| | | |
|---|---|---|
| CN | 101111899 | 1/2008 |
| JP | 2002-216467 | 8/2002 |

(Continued)

OTHER PUBLICATIONS

Office Action mailed Jun. 23, 2014 along with Search Report (in English language) in corresponding Chinese patent application No. 201280001452.0.

*Primary Examiner* — Vu Le
(74) *Attorney, Agent, or Firm* — Wenderoth, Lind & Ponack, LLP

(57) ABSTRACT

A cross point nonvolatile memory device capable of suppressing sneak-current-caused reduction in sensitivity of detection of a resistance value of a memory element is provided. The device includes perpendicular bit and word lines; a cross-point cell array including memory cells each having a resistance value reversibly changing between at least two resistance states according to electrical signals, arranged on cross-points of the word and bit lines; an offset detection cell array including an offset detection cell having a resistance higher than that of the memory cell in a high resistance state, the word lines being shared by the offset detection cell array; a read circuit (a sense amplifier) that determines a resistance state of a selected memory cell based on a current through the selected bit line; and a current source which supplies current to the offset detection cell array in a read operation period.

13 Claims, 18 Drawing Sheets

(52) U.S. Cl.
CPC ....... *G11C 2213/71* (2013.01); *G11C 2213/72* (2013.01); *G11C 2213/73* (2013.01); *G11C 2213/77* (2013.01); *G11C 13/0004* (2013.01); *G11C 2013/0054* (2013.01)
USPC .......................................... 365/148; 365/175

(56) References Cited

U.S. PATENT DOCUMENTS

| | | | |
|---|---|---|---|
| 7,248,494 | B2 | 7/2007 | Oh et al. |
| 7,405,960 | B2 * | 7/2008 | Cho et al. ...................... 365/148 |
| 7,978,495 | B2 | 7/2011 | Kawazoe et al. |
| 2002/0126524 | A1 | 9/2002 | Sugibayashi et al. |
| 2004/0004856 | A1 | 1/2004 | Sakimura et al. |
| 2006/0050548 | A1 | 3/2006 | Oh et al. |
| 2008/0205119 | A1 * | 8/2008 | Nagai et al. ................... 365/148 |
| 2009/0129140 | A1 | 5/2009 | Kawazoe et al. |

FOREIGN PATENT DOCUMENTS

| | | |
|---|---|---|
| JP | 2006-79812 | 3/2006 |
| JP | 3821066 | 9/2006 |
| WO | 2006/082695 | 8/2006 |

* cited by examiner

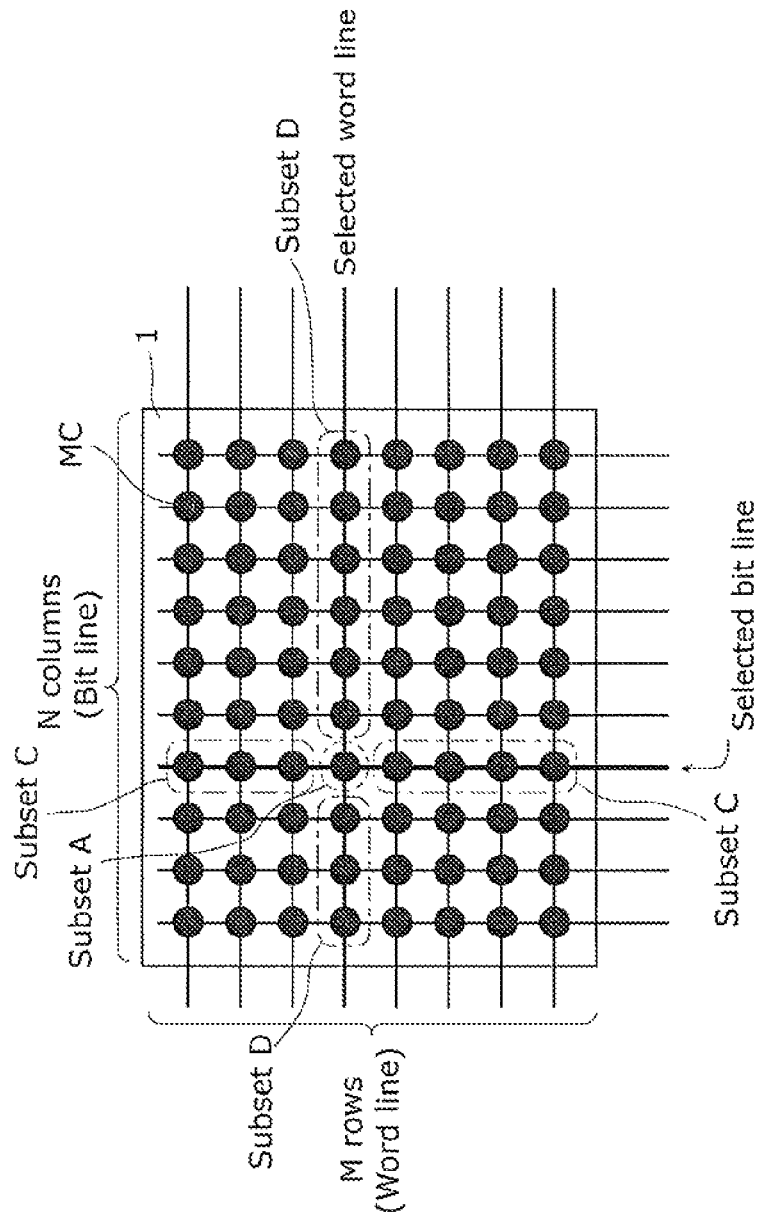

NONVOLATILE SEMICONDUCTOR MEMORY DEVICE AND READ METHOD FOR THE SAME

TECHNICAL FIELD

The present invention relates to a cross point nonvolatile semiconductor memory device which uses a variable resistance memory element, and particularly, to a cell array structure which improves determination performance for a read command signal, and to a read method for the read command signal.

BACKGROUND ART

In recent years, along with the development of digital technology, functions of electronic devices such as portable information devices and information home appliances have been further improved. Therefore, demand for large capacity of a nonvolatile memory device, low write power, high speed writing/reading, and long product life is increasing.

In order to meet such a demand, more finely structured flash memory using an existing floating gate is being developed.

On the other hand, research and development of a nonvolatile memory device having a memory element including a so-called variable resistance memory element as a replacement for a flash memory has advanced. The variable resistance memory element is an element with characteristics such that the resistance value of the element changes according to an electrical signal and is maintained (nonvolatile) even when the electrical signal is turned off, and thus the element is capable of storing information by the resistance value change.

A typical variable resistance memory element includes an MRAM (Magnetic Random Access Memory), a PRAM (Phase Change Random Access Memory), a ReRAM (Resistance Random Access Memory), a SPRAM (Spin Transfer Torque Random Access Memory), and a CBRAM (Conductive Bridge Random Access Memory).

There is known a cross-point configuration as an example of configuration technique for a nonvolatile memory device using some of these variable resistance memory elements. In the cross-point configuration, a memory cell with two terminals is disposed at the position of each of three-dimensional cross-points of bit lines and word lines which are arranged perpendicularly, the memory cell being interposed between corresponding bit line and word line. The memory cell comprises a memory element including a single variable resistance memory element, or a variable resistance memory element and a switching element with two terminals such as a diode which are connected in series, one electrode of the memory element being connected to a word line, and the other electrode of the memory element being connected to a bit line. The cross-point configuration is, as its characteristics, suitable for large-scale integration in contrast to so-called 1T1R configuration, in which a variable resistance memory element is connected to a bit line via an access transistor with three terminals.

In the cross-point configuration, memory cells are disposed in an array (hereinafter referred to as a cross-point cell array). In the cross-point configuration, when a voltage is applied to corresponding bit line and word line to detect (read) the resistance value of a memory element included in a target memory cell, a current flows through not only the detection-target memory cell, but also other memory cells connected in parallel via vertical bit lines and word lines. The current which flows through other memory cells is referred to as a sneak current herein. The sneak current depends on a state (the resistance values and their distribution of the memory elements included in all memory cells in a cross-point cell array which contains a target memory cell to be detected) of data stored in a cross-point cell array, and thus the current detected at the time of reading always contains an offset current (=sneak current) which is not constant. The sneak current prevents accurate detection of the resistance value of a memory element included in a read-target memory cell.

By adopting a configuration in which a memory element includes a switching device and a variable resistance memory element connected in series, the sneak current can be reduced. However, the sneak current increases according to the scale of a cross-point cell array, thereby preventing production of large scale cross-point cell arrays.

Patent Literature (PTL) 1 discloses a storage device having a configuration which inhibits reduction in sensitivity of detection of the resistance value of a memory element included in a memory cell, which is caused by a sneak current, the reduction in sensitivity of detection being caused by a sneak current.

CITATION LIST

Patent Literature

[PTL 1] Japanese Patent No. 3821066.

SUMMARY OF INVENTION

Technical Problem

As illustrated in FIG. 18, a cross-point cell array 601 of a storage device described in PTL 1 includes a memory cell 602 and a dummy cell 608. There is no structural difference between the memory cell 602 and the dummy cell 608, and a memory cell connected to the bit line defined as a dummy bit line 609 is used as a dummy cell. An MRAM is used in the memory element.

A subtraction circuit 617 generates a current difference signal corresponding to a difference (Is−Ic) between a detection current Is and an offset component current Ic, the detection current Is being caused to flow through a selected bit line under voltage application between a selected word line and the selected bit line, and the offset component current Ic being caused to flow through a dummy bit line under voltage application between the selected word line and the dummy bit line. A read circuit 16 determines data stored in a selected cell 602a based on the current difference signal.

The offset component current Ic has a magnitude near an offset component contained in the detection current Is. The difference (Is−Ic) between the detection current Is and the offset component current Ic enables data stored in the selected cell 602a to be determined with high reliability according to a current difference signal corresponding to the difference (I−Ic) with a high SN ratio.

An MRAM is used in the memory element in the above-described storage device. A resistance value change of MRAM is less than that of other variable resistance memory elements. The resistance value (HR) in a high resistance state is generally 1.2 to 1.4 times the resistance value (LR) in a low resistance state. Out of the current which flows through a selected cell, a current component caused to flow by a resistance component independent of the stored data is greater than a current depending on the stored data. In addition, a memory cell used in the above-described storage device comprises only MRAM, and include no switching element. Thus, PTL 1 describes that the current depending on the data stored in the selected cell 602a is approximately 1 μA, while the offset component current Ic is approximately 30 μA.

However, in the above-described storage device, the offset component current contained in the detection current Is, and the offset component current Ic which flows through the dummy bit line can be assumed to be approximately equal only under some conditions (that is to say, out of the current which flows through the selected cell, the current component caused to flow by a resistance component independent of the stored data is greater than the current depending on the stored data, and the offset component current is significantly greater than the current depending on the data stored in the selected cell) which are stated in above-described storage device.

In general, it is desirable that the offset component current should be small from viewpoints such as improvement in reading accuracy, reduction of power consumption, inhibition of deterioration of wiring (improvement of reliability) due to electromigration, reduction of position dependence of a memory cell current in a cross-point cell array along with a voltage drop due to wiring resistance, and large scaling of a cross-point cell array.

Furthermore, in a variable resistance memory element such as a PRAM, a ReRAM, and a SPRAM, the resistance change ratio between LR state and HR state is large (generally, 10 times or more), and out of the current which flows through a selected cell, a current component (sneak current component) caused to flow by a resistance component independent of the stored data is less than a current depending on the stored data.

Based on the above description, with the configuration of the storage device described in PTL 1, it is clear that no effect can be expected and no application is available except for the case that the memory element comprises only MRAM and include no switching element.

In view of the above problem, it is an object of the present invention to provide a cross point nonvolatile semiconductor memory device which uses a variable resistance memory element, and a read method thereof, the nonvolatile semiconductor memory device being capable of suppressing reduction of sensitivity of detection of the resistance value of a memory element included in a memory cell, the reduction in sensitivity of detection being caused by a sneak current.

Solution to Problem

In order to achieve the above-described object, a first aspect of a nonvolatile semiconductor memory device according to the present invention is a nonvolatile semiconductor memory device, including: word lines formed in parallel in a first plane; bit lines formed in parallel in a second plane and three-dimensionally crossing the word lines, the second plane being parallel to the first plane; a first cross-point cell array including first type cells located at three-dimensional cross-points of the word lines and the bit lines; one or more dummy bit lines formed in parallel and three-dimensionally crossing the word lines in the second plane; a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines; a word line selection circuit that selects one of the word lines as a selected word line; a bit line selection circuit that selects one of the bit lines as a selected bit line; a dummy bit line selection circuit that selects at least one of the one or more dummy bit lines as a selected dummy bit line; a read circuit that applies a predetermined voltage via the selected word line and the selected bit line to a selected cell which is a corresponding first type cell in the first cross-point cell array, and determines a resistance state of the selected cell based on a current which flows through the selected bit line; and a current source that supplies a current to the second cross-point cell array via the selected dummy bit line in a period of a read operation performed by the read circuit, wherein the first type cell includes a variable resistance element that operates as a memory by reversibly changing between at least two resistance states based on an electrical signal applied between a corresponding one of the word lines and a corresponding one of the bit lines, the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is a state of the variable resistance element when operating as the memory, and the dummy bit line selection circuit selects, as the selected dummy bit line, a dummy bit line such that the second type cell is disposed at a three-dimensional cross-point of the selected dummy bit line and the selected word line, in a period of a read operation performed by the read circuit.

Additionally, in order to achieve the above-described object, a second aspect of the nonvolatile semiconductor memory device according to the present invention is a nonvolatile semiconductor memory device, including: word lines formed in parallel in a first plane; bit lines formed in parallel in a second plane and three-dimensionally crossing the word lines, the second plane being parallel to the first plane; a first cross-point cell array including one or more first type cells located at three-dimensional cross-points of the word lines and the bit lines; one or more dummy bit lines formed in parallel and three-dimensionally crossing the word lines in the second plane; a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines; a word line selection circuit that selects one of the word lines as a selected word line; a bit line selection circuit that selects one of the bit lines as a selected bit line; a dummy bit line selection circuit that selects at least one of the one or more dummy bit lines as a selected dummy bit line; a read circuit that applies a predetermined voltage via the selected word line and the selected bit line to a selected cell which is a corresponding first type cell in the first cross-point cell array, and determines a resistance state of the selected cell based on a current which flows through the selected bit line; and a current detection circuit that detects a current which flows through the second cross-point cell array via the selected dummy bit line in a period of a read operation performed by the read circuit, wherein the first type cell includes a variable resistance element that operates as a memory by reversibly changing between at least two resistance states based on an electrical signal applied between a corresponding one of the word lines and a corresponding one of the bit lines, the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is a state of the variable resistance element when operating as the memory, the dummy bit line selection circuit selects a dummy bit line as the selected dummy bit line such that the second type cell is disposed at a three-dimensional cross-point of the selected dummy bit line and the selected word line, in a period of a read operation performed by the read circuit, and the read circuit determines a resistance state of the selected cell based on a value corresponding to the current which flows through the selected bit line, and a value according to the current which flows through the second cross-point cell array and is detected by the current detection circuit.

The present invention can be implemented not only as a nonvolatile semiconductor memory device, but also as a read method for a nonvolatile semiconductor memory device.

Advantageous Effects of Invention

In a cross point nonvolatile semiconductor memory device which uses a variable resistance memory element of the present invention, the problem related to a cross-point circuit, i.e., the problem of reduced detection sensitivity due to sneak current at the time of reading a resistance value of a memory element can be prevented, and thus the effect of improved reading accuracy is achieved.

BRIEF DESCRIPTION OF DRAWINGS

FIG. 19 is a schematic diagram of a conventional cross-point cell array.

DESCRIPTION OF EMBODIMENTS

[Summary]

Figure 1:
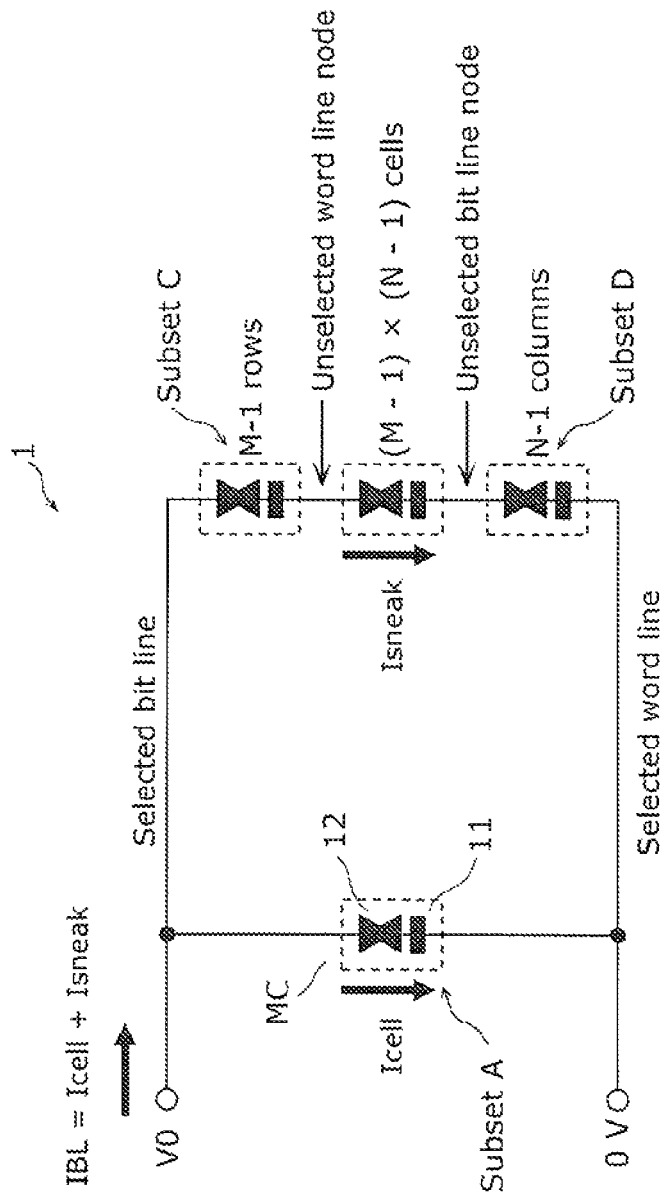
FIG. 1 is an equivalent circuit diagram of a cross-point cell array illustrated in FIG. 19.

A first embodiment of a nonvolatile semiconductor memory device according to the present invention is a nonvolatile semiconductor memory device, including: word lines formed in parallel in a first plane; bit lines formed in parallel in a second plane and three-dimensionally crossing the word lines, the second plane being parallel to the first plane; a first cross-point cell array including first type cells located at three-dimensional cross-points of the word lines and the bit lines; one or more dummy bit lines formed in parallel and three-dimensionally crossing the word lines in the second plane; a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines; a word line selection circuit that selects one of the word lines as a selected word line; a bit line selection circuit that selects one of the bit lines as a selected bit line; a dummy bit line selection circuit that selects at least one of the one or more dummy bit lines as a selected dummy bit line; a read circuit that applies a predetermined voltage via the selected word line and the selected bit line to a selected cell which is a corresponding first type cell in the first cross-point cell array, and determines a resistance state of the selected cell based on a current which flows through the selected bit line; and a current source that supplies a current to the second cross-point cell array via the selected dummy bit line in a period of a read operation performed by the read circuit, wherein the first type cell includes a variable resistance element that operates as a memory by reversibly changing between at least two resistance states based on an electrical signal applied between a corresponding one of the word lines and a corresponding one of the bit lines, the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is a state of the variable resistance element when operating as the memory, and the dummy bit line selection circuit selects, as the selected dummy bit line, a dummy bit line such that the second type cell is disposed at a three-dimensional cross-point of the selected dummy bit line and the selected word line, in a period of a read operation performed by the read circuit.

Thus, a current is applied to unselected word lines via a dummy bit line by the current source in the period of reading from the selected cell, and therefore, sneak current component in the current detected by the read circuit, i.e., the current which flows through the selected bit line is suppressed, and S/N in reading the selected cell increases.

A second embodiment of the nonvolatile semiconductor memory device according to the present invention is a nonvolatile semiconductor memory device, including: word lines formed in parallel in a first plane; bit lines formed in parallel in a second plane and three-dimensionally crossing the word lines, the second plane being parallel to the first plane; a first cross-point cell array including one or more first type cells located at three-dimensional cross-points of the word lines and the bit lines; one or more dummy bit lines formed in parallel and three-dimensionally crossing the word lines in the second plane; a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines; a word line selection circuit that selects one of the word lines as a selected word line; a bit line selection circuit that selects one of the bit lines as a selected bit line; a dummy bit line selection circuit that selects at least one of the one or more dummy bit lines as a selected dummy bit line; a read circuit that applies a predetermined voltage via the selected word line and the selected bit line to a selected cell which is a corresponding first type cell in the first cross-point cell array, and determines a resistance state of the selected cell based on a current which flows through the selected bit line; and a current detection circuit that detects a current which flows through the second cross-point cell array via the selected dummy bit line in a period of a read operation performed by the read circuit, wherein the first type cell includes a variable resistance element that operates as a memory by reversibly changing between at least two resistance states based on an electrical signal applied between a corresponding one of the word lines and a corresponding one of the bit lines, the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is a state of the variable resistance element when operating as the memory, the dummy bit line selection circuit selects a dummy bit line as the selected dummy bit line such that the second type cell is disposed at a three-dimensional cross-point of the selected dummy bit line and the selected word line, in a period of a read operation performed by the read circuit, and the read circuit determines a resistance state of the selected cell based on a value corresponding to the current which flows through the selected bit line, and a value according to the current which flows through the second cross-point cell array and is detected by the current detection circuit.

Thus, the resistance state of the selected cell is determined based on the sneak current detected by the current detection circuit and the current detected by the read circuit (i.e., the total of the current flowing through the selected cell and the sneak current), and therefore, high-precision reading with the sneak current component cancelled can be achieved.

The above-described first embodiment of second embodiment differ in whether the sneak current is applied or detected, however, both embodiments are common in that:
(1) an offset detection cell array different from a cross-point cell array is provided,
(2) the current flowing through the offset detection cell array (more particularly, dummy bit line) is used, and
(3) high-speed reading with the sneak current removed is achieved by performing processing on the sneak current simultaneously (in parallel) with detection (reading) of the current which flows through the selected cell.

The nonvolatile semiconductor memory device may further include a first current summing circuit that generates a first summed current which is a sum of (i) a current flowing through a reference cell which includes the first type cell and is set in a first resistance state out of the at least two resistance states, and (ii) a current obtained by amplifying the current detected by the current detection circuit by X times; and a second current summing circuit that generates a second summed current which is a sum of a current and another current, the current flowing through a reference cell which includes the first type cell and is set in a second resistance state out of the at least two resistance states, and the another current being obtained by amplifying the current detected by the current detection circuit by X times, wherein the read circuit determines the resistance state based on a criterion with a value of a reference level which is an average of the first summed current and the second summed current. Thus, a reference level is generated by using not only the sneak current but also the current flowing through the reference cells in the memory cells, which are set to two resistance states, and the reference level can be compared with the current which has flown through the selected bit line. Thus, the current which has flown through the selected bit line undergoes processing of cancellation of sneak current, and is compared with the current which has flown through the reference cells, and therefore, the resistance state of the selected cell is accurately determined based on the current which has flown through the selected bit line.

The read circuit may include a first load circuit and a second load circuit, supply from the second load circuit a current obtained by amplifying the current detected by the current detection circuit by a predetermined factor, generate a voltage corresponding to a difference between the supplied current and the current which flows through the selected bit line, by the first load circuit, and determine the resistance state of the selected cell by comparing the generated voltage with a predetermined reference voltage. Thus, the sneak current component is removed from the current which has flown through the selected bit, and a voltage corresponding to the current of the signal component after the removal is compared with a reference voltage, and therefore, the resistance state of the selected cell is accurately determined with the sneak current component removed.

The current detection circuit may generate a timing signal having a timing determined by a discharge time which depends on the current so as to latch data indicating the resistance state based on the timing signal. Thus, the resistance state of the selected cell can be determined at a timing which depends on the magnitude of the sneak current, and therefore, stable reading can be achieved, and reading speed is increased more than that of a reading method in which a fixed delay time is provided.

The nonvolatile semiconductor memory device may further include a monitor terminal which is connected to the dummy bit line selected by the dummy bit line selection circuit, and which allows probing from an outside of the nonvolatile semiconductor memory device. Thus, the sneak current can be directly measured using the monitor terminal, and off characteristics of a switching element., which is a causing factor of sneak current, can be directly evaluated.

The first type cell disposed in the second cross-point cell array may be set in a resistance state which is a lower resistance state out of the at least two resistance states. Thus, the sneak current supplied from the dummy bit line increases, and the sneak current component which flows through the selected bit line can be relatively reduced, and therefore, the S/N in reading the selected cell increases.

General discussion in terms of the magnitudes of the currents which are respectively distributed to the selected bit line and the dummy bit line is as follows. A current Isneak is distributed to the selected bit line and the one or more dummy bit lines with a ratio of IBL:IDBL=M:A×B, where the first cross-point cell array is a cell array with M rows and N columns, defined by M word lines and N bit lines, A (a natural number such that $1 \leq A \leq M-1$) pieces of the first type cell are disposed on each of the one or more dummy bit lines of the second cross-point cell array, B (a natural number such that $1 \leq B \leq N$) pieces of dummy bit line are simultaneously selected by the dummy bit line selection circuit, Isneak is a total of sneak current which flows through the selected word line, IBL is an absolute value of a sneak current flowing from the selected bit line, and IDBL is an absolute value of a sneak current flowing from the one or more dummy bit lines.

The X preferably satisfies $0.8 \times M/(A \times B) \leq X \leq 1.2 \times M/(A \times B)$, where the first cross-point cell array is a cell array with M rows and N columns, defined by M word lines and N bit lines, A (a natural number such that $1 \leq A \leq M-1$) pieces of the first type cell are disposed on each of the one or more dummy bit lines of the second cross-point cell array, and B (a natural number such that $1 \leq B \leq N$) pieces of dummy bit line are simultaneously selected by the dummy bit line selection circuit. Thus, the sneak current which flows through the dummy bit line, and the sneak current component included in the current which flows through the selected bit line can be matched, and therefore, the sneak current component can be easily removed from the current which flows through the selected bit line.

The present invention may be achieved not only as a nonvolatile semiconductor memory device, but also as a method of reading data from a first type cell in a nonvolatile semiconductor memory device which includes: word lines formed in parallel in a first plane; bit lines formed in parallel in a second plane three-dimensionally crossing the word lines, the second plane being parallel to the first plane; a first cross-point cell array including one or more first type cells at three-dimensional cross-points of the word lines and the bit lines; one or more dummy bit lines formed in parallel and three-dimensionally crossing the word lines in the second plane; a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines; the first type cell includes a variable resistance element that operates as a memory by reversibly changing between at least two resistance states based on an electrical signal applied between a corresponding one of the word lines and a corresponding one of the bit lines; and the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is assumed by the variable resistance element when operating as the memory, the method including: selecting one of the word lines as a selected word line, and selecting one of the bit lines as a selected bit line; selecting at least one of the one or more dummy bit lines as a selected dummy bit; applying a predetermined voltage via the selected word line and the selected bit line to a selected cell which is a corresponding first type cell in the first cross-point cell array, and determining a resistance state of the selected cell based on a current which flows through the selected bit line; and supplying a current to the second cross-point cell array via the selected dummy bit line in a period of a read operation performed in the applying, wherein in the selecting at least one of the one or more dummy bit lines, selecting, as the selected dummy bit line, a dummy bit line such that the second type cell is disposed at a three-dimensional cross-point of the dummy bit line and the selected word line, in a period of a read operation performed in the applying.

In addition, the present invention may be achieved as a method of reading data from a first type cell in a nonvolatile semiconductor memory device which includes: word lines formed in parallel in a first plane; bit lines formed in parallel in a second plane and three-dimensionally crossing the word lines, the second plane being parallel to the first plane; a first cross-point cell array including first type cells located at three-dimensional cross-points of the word lines and the bit lines; one or more dummy bit lines formed in parallel and three-dimensionally crossing the word lines in the second plane; a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines; the first type cell includes a variable resistance element that operates as a memory by reversibly changing between at least two resistance states based on an electrical signal applied between a corresponding one of the word lines and a corresponding one of the bit lines; and the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is assumed by the variable resistance element when operating as the memory, the method including: selecting one of the word lines as a selected word line, and selecting one of the bit lines as a selected bit line; selecting at least one of the one or more dummy bit lines as a selected dummy bit; applying a predetermined voltage via the selected word line and the selected bit line to a selected cell which is a corresponding first type cell in the first cross-point cell array, and detecting a current which flows through the selected bit line; detecting a current which flows through the second cross-point cell array via the selected dummy bit line in a period of a current detection performed in the applying; and determining a resistance state of the selected cell based on a value corresponding to the current which flows through the selected bit line and is detected in the applying, and a value according to the current which flows through the second cross-point cell array and is detected in the detecting, wherein in the selecting at least one of the one or more dummy bit lines, selecting, as the selected dummy bit line, a dummy bit line such that the second type cell is disposed at a three-dimensional cross-point of the dummy bit line and the selected word line, in a period of a current detection performed in the applying.

[Embodiment]

Hereinafter, an embodiment of the present invention will be described with reference to the drawings. Each of the embodiments described below illustrates a specific example of the present invention. Numerical values, shapes, materials, components, arrangement positions and topologies of the components, steps, and order of the steps shown in the following embodiments are examples, and not intended to limit the present invention. Those components in the following embodiments, which are not stated in the independent claim that defines the most generic concept are each described as an arbitrary component.

The same element may be labeled with the same symbol and description thereof may be omitted.

In the present invention, the configurations of memory elements and wiring are schematically illustrated. In addition, the numbers of memory elements and wiring are adjusted for the purpose of clarity of illustration.

Although only cross-point cell array with one layer is described herein with reference to the drawings, the present invention is not limited to the cross-point cell array with one layer only, and a similar effect may be obtained in a cross-point cell array with at least two layers by applying the configuration of the present invention to a corresponding cross-point cell array for each layer.

First, the basic principle of the nonvolatile semiconductor memory device in the subsequent embodiments is described from the viewpoint of sneak current in an operating state of the cross-point cell array in comparison with conventional technology.

FIG. 19 illustrates the configuration of a conventional cross-point cell array. In a cross-point cell array 1, a word line group including M rows are arranged in the row direction, a bit line group including N columns are arranged in the column direction, and a memory cell MC indicated by a black circle is disposed at each of three-dimensional cross-points. Although FIG. 19 is illustrated in a matrix with 8 rows and 10 columns for the sake of simplicity, in reality, predetermined numbers of memory cells (M rows and N columns) are arranged in the row and column directions, respectively.

Generally, in the cross-point cell array 1, a word line is selected from the word line group, a bit line is selected from the bit line group, and a write or read operation is performed on the memory cell located at a three-dimensional cross-point area A by applying a predetermined write voltage or read voltage between the selected word line and bit line.

FIG. 1 is a simplified equivalent circuit diagram of the impedances as observed from the selected bit line and the selected word line when the memory cell located at the three-dimensional cross-point area A is selected by the lines denoted as selected word line and the selected bit line in the cross-point cell array 1 of FIG. 19.

Here, the memory cell MC primarily comprises a variable resistance element 11 and a switching element. 12 that are connected in series (strictly speaking, the memory cell MC comprises a memory element and two vias, and the memory element further comprises a variable resistance element and a switching element. as described below). The switching element. 12 comprises an MSM (Metal-Semiconductor-Metal) diode which is formed, for example, in three stacked layer structure having a semiconductor layer and metal electrode layers between which the semiconductor layer is interposed. The switching element, 12 has nonlinear and almost symmetric bidirectional current characteristics under voltage application between both ends. For this reason, the drive current increases rapidly with a predetermined threshold voltage or greater, however, an off-state current flows with the threshold voltage or lower. The memory cell MC is a memory cell included in the cross-point cell array 1, i.e., a memory cell with two terminals, and comprises a single variable resistance memory element, or a variable resistance memory element and a switching element. with two terminals, such as a diode, which are connected in series. The diode may be a unidirectional diode which allows a current to flow in only one direction. The diode may be a bidirectional diode which has respective threshold voltages in both positive and negative directions, and allows a current to flow in both directions under application of a voltage greater than or equal to the respective threshold voltages.

A write or read operation is performed by applying a predetermined voltage to a selected bit line relatively to a selected word line with unselected word lines and unselected bit lines left open. In this process, flowing current is mainly divided into two paths.

The first path is a path through which a current flows via the cross-point area A on the selected bit line and the selected word line, that is to say, the first path is a current path created when a write or read operation is performed by selecting the memory cell MC (selected memory cell) located at the cross-point area A.

The second path is a path of sneak current (sneak current path) which flows through a path created by three unselected memory cells connected in-series.

The relationship between the equivalent circuit illustrated in FIG. 1 and the cross-point cell array 1 illustrated in FIG. 19 will be described below.

In the cross-point cell array 1 illustrated in FIG. 19, a group of (M−1) unselected memory cells located in area C excluding the selected memory cell corresponding to area A on the selected bit line serves as a current inflow portion of the sneak current, and provides a connection to the middle stage ("(M−1)×(N−1) pieces of unselected memory cells" in FIG. 1) via unselected word lines ("unselected word line node" in FIG. 1) on the opposite end. The group ((M−1) unselected memory cell group located in area C) corresponds to the upper stage of the sneak current path, and M−1 pieces of memory cells excluding the selected memory cell are connected in parallel.

Similarly, a group of (N−1) unselected memory cells located in area D excluding the selected memory cell corresponding to area A on the selected word line serves as a current outflow portion of the sneak current from the unselected word lines ("unselected word line node" in FIG. 1) of the middle stage ("(M−1)×(N−1) pieces of unselected memory cells" in FIG. 1) on the opposite end. The group ((N−1) unselected memory cell group located in area D) corresponds to the lower stage of the sneak current path, and (N−1) pieces of memory cells excluding the selected memory cell are connected in parallel.

Then (M−1)×(N−1) pieces of unselected memory cells belonging to the unselected word lines and unselected bit lines interconnect between both current inflow portion and current outflow portion as the middle stage ("(M−1)×(N−1) pieces of unselected memory cells" in FIG. 1).

As illustrated in the equivalent circuit in FIG. 1, a current IBL which flows from the selected bit line to the selected word line of the cross-point cell array 1 is the sum of a current Icell which flows through the selected memory cell and a current Isneak which flows through the sneak current path, and this can be expressed by IBL=Icell+Isneak.

For example, in a read operation, the sneak current Isneak causes a noise component (N: noise) which interferes with stored information (S: signal) on the selected memory cell, and thus in order to increase the S/N for speed-increasing and stabilizing the reading performance, the current Isneak observed from the selected bit line needs to be reduced.

As illustrated in the equivalent circuit, the impedance of the sneak current path is low because the number of memory cells on the middle stage is (M−1)×(N−1) which has a square order, and the impedance primarily depends on the number of memory cells on the upper stage and the lower stage. Consequently, it can be found that the sneak current is rate-controlled according to the impedance which is dominantly determined by either the upper stage or the lower stage which includes less number of memory cells.

Figure 2:
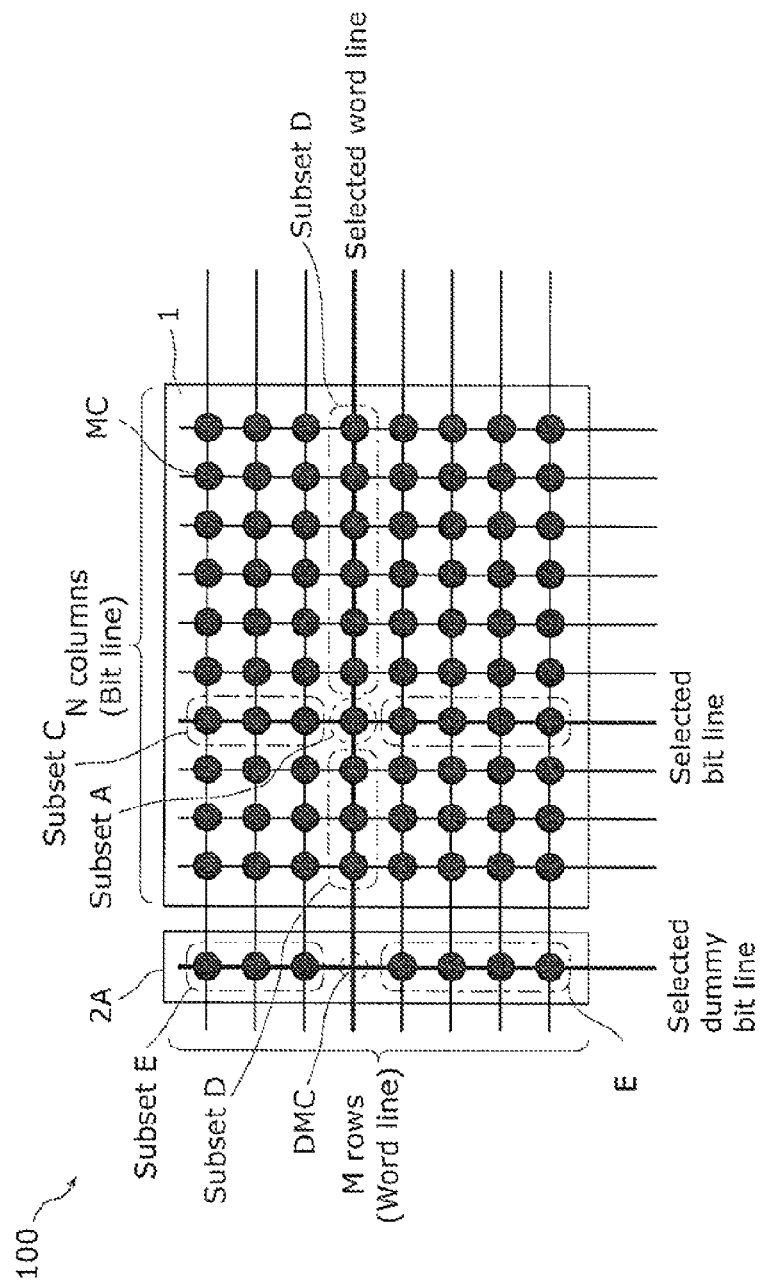
FIG. 2 is a configuration diagram of a cross-point cell array block for explaining the principle of the present invention.

FIG. 2 illustrates a configuration of an exemplary cross-point cell array block 100 of the present invention. Using this example, the principle of operation of the cross-point cell array block 100 of the present invention will be described. The cross-point cell array block 100 comprises the cross-point cell array 1 and an offset detection cell array 2A.

The cross-point cell array 1 is the same as the conventional cross-point cell array illustrated in FIG. 19, and thus description thereof is omitted.

The offset detection cell array 2A is disposed adjacent to the cross-point cell array 1 with the word lines shared by both arrays. In this example, one dummy bit line is arranged on the offset detection cell array 2A in the column direction. The memory cell MC is indicated by a black circle or a dashed line circle at a three-dimensional cross-point of the dummy bit line and each word line, and an electrically non-conductive offset detection cell DMC is disposed at the three-dimensional cross-point. In the present embodiment, an offset detection cell DMC is disposed at only one location, and in an operating state, one dummy bit line is selected as a selected dummy bit line along with the cross-point cell array 1.

Hereinafter, the operation performed when the word line ("selected word line" in FIG. 2) in which the offset detection cell DMC is disposed is selected will be described. The selected memory cell located at a three-dimensional cross-point of the selected word line and the selected dummy bit line is referred to as an area A, the unselected memory cells on the selected bit line is referred to as an area C, the unselected memory cells on the selected word line is referred to as an area D, and the memory cells on the selected dummy bit line except for the three-dimensional cross-point of the selected word line and the selected dummy bit line, i.e., the offset detection cell DMC is referred to as an area E.

Figure 3:
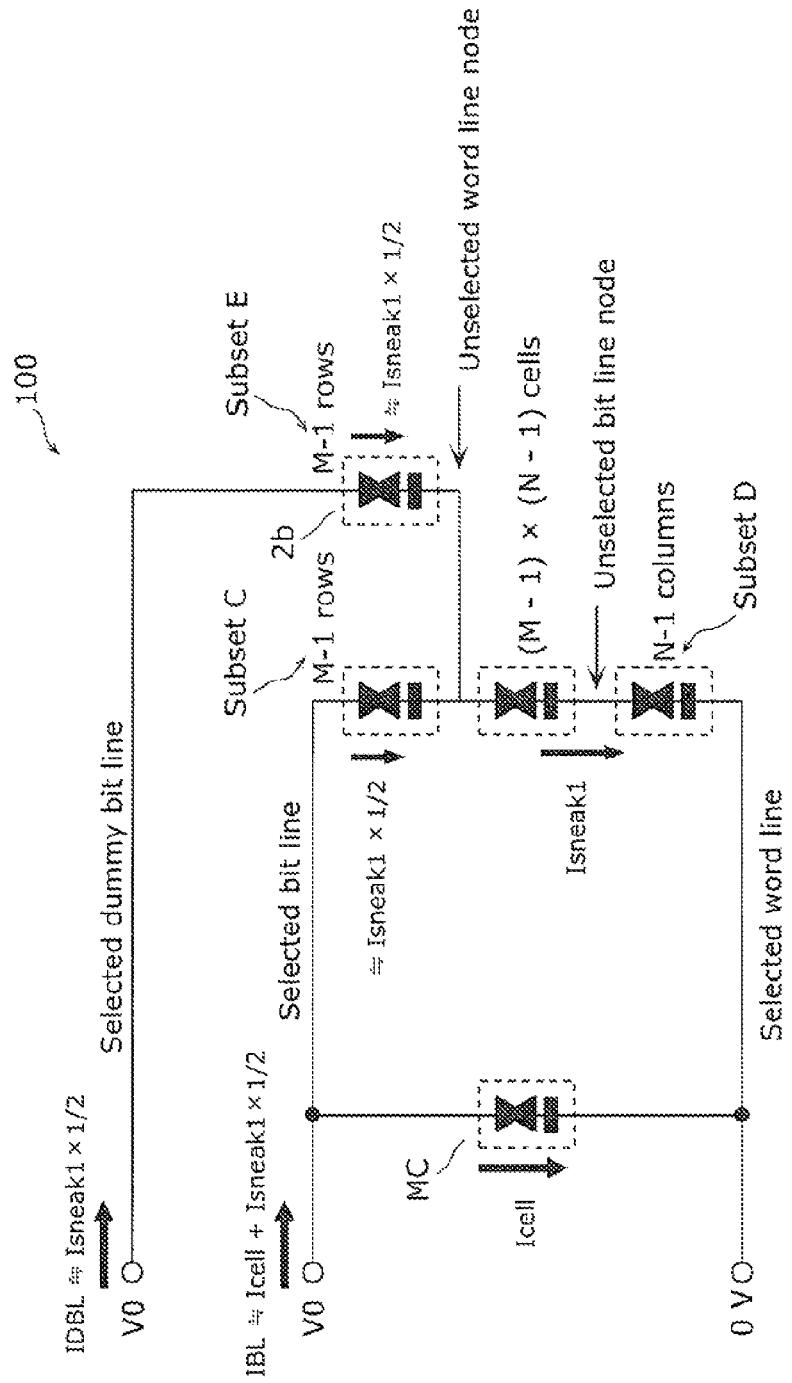
FIG. 3 is an equivalent circuit diagram of the cross-point cell array block illustrated in FIG. 2.

FIG. 3 is a simplified equivalent circuit diagram of the impedance when the memory cell MC located at the three-dimensional cross-point area A is selected in the cross-point cell array block 100 in the present invention. Here, it is assumed that the same voltage is applied to both the selected bit line and the dummy bit line. In the following description, the portion of FIG. 3 which overlaps with FIG. 1 which is omitted. In the same manner as before, the unselected word lines, the unselected bit lines, and unselected dummy bit lines are each left in an open state.

The current path between each of the selected bit line and the selected dummy bit line, and the selected word line is mainly divided into three paths.

The first path is a path through which a current flows via the three-dimensional cross-point area A selected by the selected bit line and the selected word line, that is to say, the first path is a current path created when a write or read operation is performed by selecting the memory cell MC (selected memory cell) located at the three-dimensional cross-point area A.

The second path is a path which leads from the unselected memory cell area C on the selected bit line to the unselected memory cell area D on the selected word line. The description above is the same as that of the first and second paths described with reference to FIG. 1.

The third path is a path along which a current flows to the unselected ward lines ("the unselected word line node" in FIG. 1) in an open state via the memory cells in area E on the selected dummy bit line, and merges with the sneak current path of the cross-point cell array 1 to flow out to the selected word line. Although the offset detection cell DMC is disposed at the three-dimensional cross-point of the selected dummy bit line and the selected word line, the offset detection cell DMC is electrically non-conductive, and thus there is no direct current inflow path to the selected word line. The number of three-dimensional cross-points of the selected dummy bit line and the unselected word lines, except for the above cross-point (the three-dimensional cross-point of the selected dummy bit line and the selected word line) is the same as that of the selected bit line, i.e., (M−1).

According to the equivalent circuit indicated in FIG. 3, the current (bit line current) IBL which flows from the selected bit line to the selected word line in the cross-point cell array block 100, and the current (dummy bit line current) IDBL which flows from the selected dummy bit line to the selected word line are generally expressed as follows.

Assuming that the current which flows through the selected memory cell is Icell, and the total sneak current which merges with the selected word line via area D is Isneak1, both the selected bit line and the selected dummy bit line have the same number of cross-points except for the cross-point with the selected word line, and thus the magnitudes of the current flowing through those cross-points are almost the same, which is Isneak1/2. Consequently, the bit line current IBL and the dummy bit line current. IDBL are respectively expressed by the following:

$$IBL = Icell + Isneak1 \times 1/2 \qquad \text{(Expression 1)}$$

$$IDBL = Isneak1 \times 1/2 \qquad \text{(Expression 2)}$$

The above Expression 1 indicates that the sneak current Isneak1 of the selected bit line path can be reduced almost by half by flowing a bypass current from the selected dummy bit line to the unselected word lines. That is to say, when observed from a sense amplifier which is assumed to be a circuit at the connection destination of the selected bit line, the sneak current is reduced by half and the S/N increases, and thus speed enhancement and stabilization of the reading performance can be achieved.

In addition, Expression 2 indicates that the sneak current Isneak1 can be directly measured by measuring the dummy bit line current IDBL.

In addition to the factors determined by the configuration of the nonvolatile semiconductor memory device, such as the capacity of the cross-point cell array and the off-state current characteristics of the switching element. constituting each memory cell, the sneak current is caused by factors which cannot be uniquely determined, and which vary with resistance value setting to the memory cell, the ratio of data '1', '0' in write data, and the ambient temperature or the like. For this reason, when a read operation is performed by detecting a bit line current with a sense amplifier, it is desirable to make determination in consideration of the sneak current at the operation time for achieving a stable operation.

Expression 1 and Expression 2 indicate that performing a difference operation which subtracts the dummy bit line current IDBL from the bit line current IBL can be used as a method of detecting the current Icell which flows through the memory cell MC only, or a method of detection in which the relative magnitude of the dummy bit line current IDBL is jointly used for the determination level of the sense amplifier. Thus, the influence of the sneak current Isneak1 can be eliminated and a more stable read operation of the cross-point cell array can be achieved.

Figure 4:
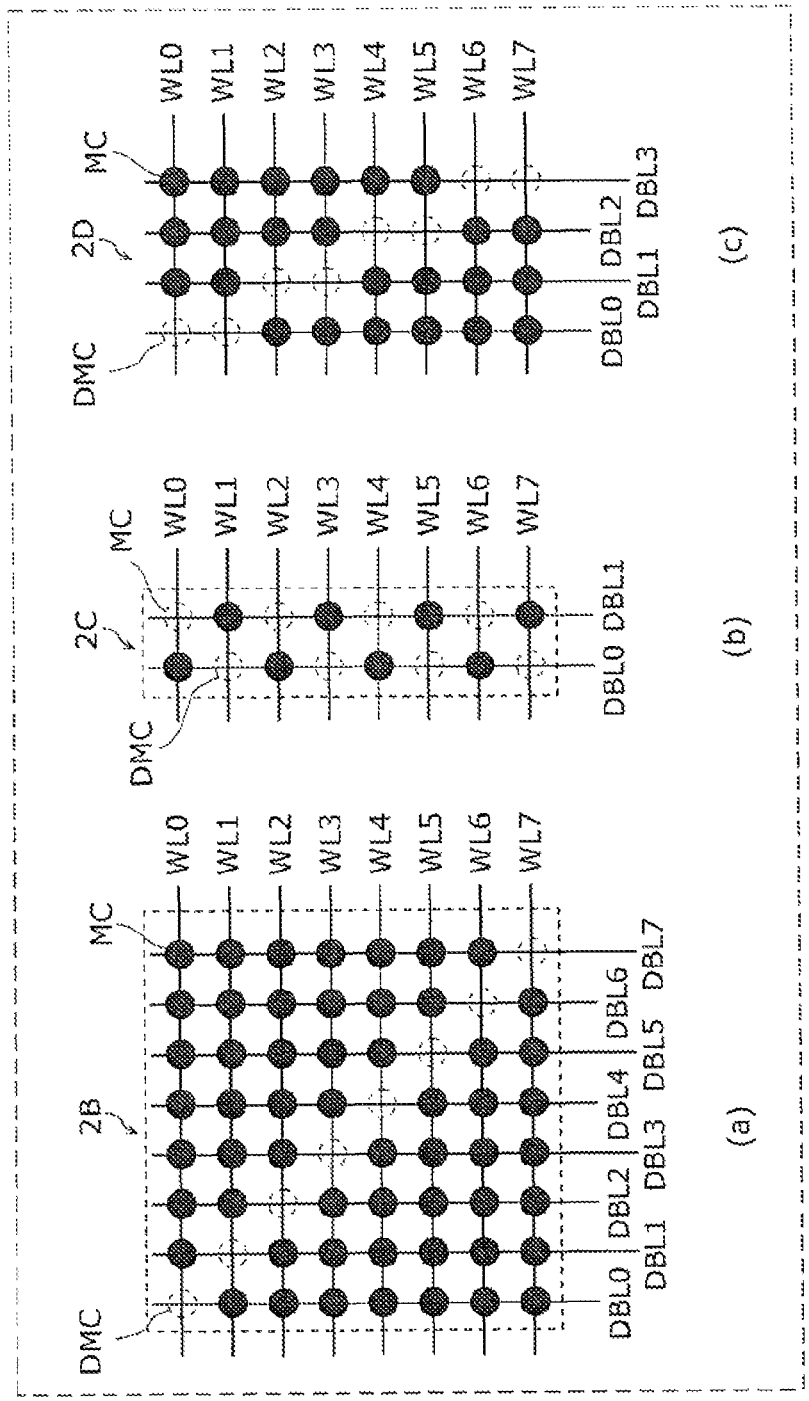
FIG. 4 is an example of a developed offset detection cell array of the present invention.

FIG. 4 illustrates various examples of developed offset detection cell array.

An offset detection cell array 2B indicated in (a) in FIG. 4 has a plurality of dummy bit lines DBL0 to DBL7, and adopts a configuration in which the offset detection cell DMC in the offset detection cell array 2A described with reference to FIG. 2 is disposed one by one on each of the word lines WL0 to WL7. Control is performed such that when the word line WL0 is selected, the dummy bit line DBL0 is selected, and when the word line WL1 is selected, the dummy bit line DBL1 is selected. In this manner, the above-described effect can be obtained by performing selection control over the dummy bit line, so that for the selection of any of the word lines WL0 to WL7, the offset detection cell DMC is disposed at the three-dimensional cross-point of the selected dummy bit line and the selected word line.

It should be noted that the offset detection cells DMC are not necessarily disposed diagonally as illustrated in FIG. 4(a). A configuration such as that of an offset detection cell array 2C illustrated in (b) in FIG. 4 or an offset detection cell array 2D illustrated in (c) in FIG. 4 may be adopted.

The offset detection cell array 2C illustrated in (b) in FIG. 4 has two dummy bit lines DBL0 and DBL1, and adopts a configuration in which the offset detection cells DMC are arranged in a checkered pattern so as to be alternately disposed on the cross-points of the two dummy bit lines and odd-numbered word lines, even-numbered word lines. When one of the even-numbered word lines WL0, WL2, WL4, ... is selected, the dummy bit line DBL1 is selected, on which the offset detection cells DMC are disposed at the three-dimensional cross-points with the even-numbered word lines, and when one of the odd-numbered word lines WL1, WL3, WL5, ... is selected, the dummy bit line DBL0 is selected, on which the offset detection cells DMC are disposed at the three-dimensional cross-points with the odd-numbered word lines. With the configuration of the offset detection cell array 2B illustrated in (a) in FIG. 4, as many dummy bit lines as the target word lines are necessary. However, the configuration of the offset detection cell array 2C illustrated in (b) in FIG. 4 may be implemented by two dummy bit lines at the minimum. Therefore, the configuration as in (b) in FIG. 4 is effective in reducing the area of a nonvolatile semiconductor memory device provided with the offset detection cell array.

The offset detection cell array 2D illustrated in FIG. 4(c) has four dummy bit lines DBL0 to DBL3, and adopts a configuration in which two offset detection cells DMC are disposed on each dummy bit line. Because one dummy bit line is served by two word lines in the offset detection cell array 2D, the offset detection cell array 2D can be constituted by half as many dummy bit lines as those of the offset detection cell array 2B. Therefore, the configuration as in (c) in FIG. 4 is effective in reducing the area of a nonvolatile semiconductor memory device provided with the offset detection cell array.

In the offset detection cell array 2C illustrated in (b) in FIG. 4, the inflow path of the sneak current is the cross-points of the dummy bit lines and the even-numbered word lines or the three-dimensional cross-points of the dummy bit lines and the odd-numbered word lines, and thus the offset detection cell array 2C has half as many three-dimensional cross-points as those of the offset detection cell array 2B. For this reason, detectable sneak current observed from the selected dummy bit line, i.e., the dummy bit line current IDBL indicated by the above Expression 2 is reduced by half, and there is a concern that detection sensitivity may reduce. On the other hand, the offset detection cell array 2D illustrated in (c) in FIG. 4 has one less as many sneak current inflow portions as those of the offset detection cell array 2B, and thus reduction in detection sensitivity can be neglected, and highly sensitive detection of offset current can be achieved with a small surface area.

As described above, the characteristic of the present invention is that the dummy bit lines which are not to be accessed for writing or reading are provided, and in which at least one cross-point with the word line to be accessed is provided with an offset detection cell DMC.

Next, the configuration of the memory cell MC and the offset detection cell DMC will be described.

Figure 5:
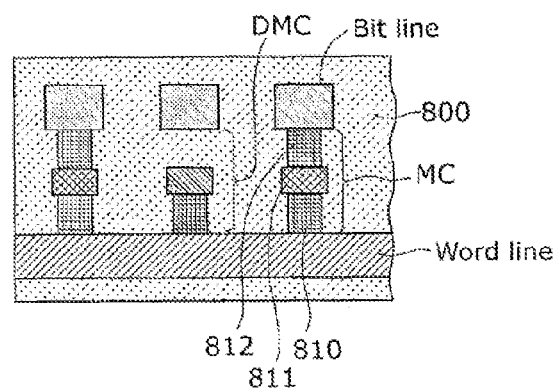
FIG. 5 illustrates cross-sectional views of the offset detection cell of the present invention and two memory cells adjacent to the offset detection cell.

FIG. 5 is a cross-sectional view of the cross-point cell array block 100 in FIG. 2, taken on a plane along the selected word line. In FIG. 5, the sectional structure of the offset detection cell DMC and two memory cells MC adjacent thereto is illustrated. As illustrated in FIG. 5, the memory cell MC according to the present invention comprises a first via 810 for electrically connecting a memory element 811, a memory element 811, and a word line; and a second via 812 for electrically connecting a memory element 811 and a bit line.

The memory element 811 comprises a variable resistance memory element, or a variable resistance memory element and a switching element. connected in series. In the variable resistance memory element used here, the resistance value between two terminals changes accordingly to an electric signal, and is maintained even when the electric signal is set off (nonvolatility is maintained). The variable resistance memory element is an element which can store information by the change of the resistance value. Specifically, the memory element 811 may be replaced by a MRAM (Magnetic Random Access Memory), an MRAM (Magnetic Random Access Memory), a PRAM (Phase Change Random Access Memory), a ReRAM (Resistec Random Access Memory), a SPRAM (Spin Transfer Torque Random Access Memory), or the like. The memory element 811 stores 1-bit data by the variable-resistance memory element included therein associating one of a high resistance state (HR) and a low resistance state (LR) with "1", and associating the other of the high resistance state and the low resistance state with "0."

The switching element used here may be replaced by an element having nonlinear switching characteristics such as an MSM (Metal-Semiconductor-Metal) diode formed in three stacked layer structure having a semiconductor layer and metal electrode layers (i.e., a first metal electrode and a second metal electrode) between which the semiconductor layer is interposed, an MIM (Metal-Insulator-Metal) diode formed in three stacked layer structure having an insulator layer and metal electrode layers between which the insulator layer is interposed, pn junction diode formed in two stacked layer structure having a p-type semiconductor and an n-type semiconductor, or a schottky diode formed in two stacked layer structure having a semiconductor layer and a metal electrode layer.

As illustrated in FIG. 5, the offset detection cell DMC has a configuration, for example, in which the second via 812 is removed from the memory cell MC. Although the detail will be described below, the function of the offset detection cell DMC is to measure an approximate value of the sneak current in the cross-point cell array 1, for example. The configuration of the offset detection cell DMC may be adopted such that the current flowing through the offset detection cell DMC when a potential difference at the time of reading is applied between the word line and dummy bit line below and above the offset detection cell DMC is smaller than the current flowing through the memory cell MC when the variable resistance memory element included in the memory element 811 is in a high resistance state, and a potential difference at the time of reading is applied between the word line and bit line below and above the memory cell MC. That is to say, irrespective of an electric signal applied between the corresponding word line and the corresponding dummy bit line, the offset detection cell DMC has a resistance value higher than that of the memory element in a high resistance state when the memory element (or variable resistance memory element) in the memory cell MC performs a memory operation.

In contrast to the structure of the memory cell MC, the offset detection cell DMC illustrated in FIG. 5 is configured such that the second via 812 is not formed, thereby generating almost zero current which flows through the offset detection cell DMC when a potential difference at the time of reading is applied between the word line and dummy bit line below and above the offset detection cell DMC. In this case, no difference is observed between the memory cell MC and the offset detection cell DMC in the manufacturing process until the memory element 811 and an interlayer insulating film 800 thereabove are formed.

Figure 6:
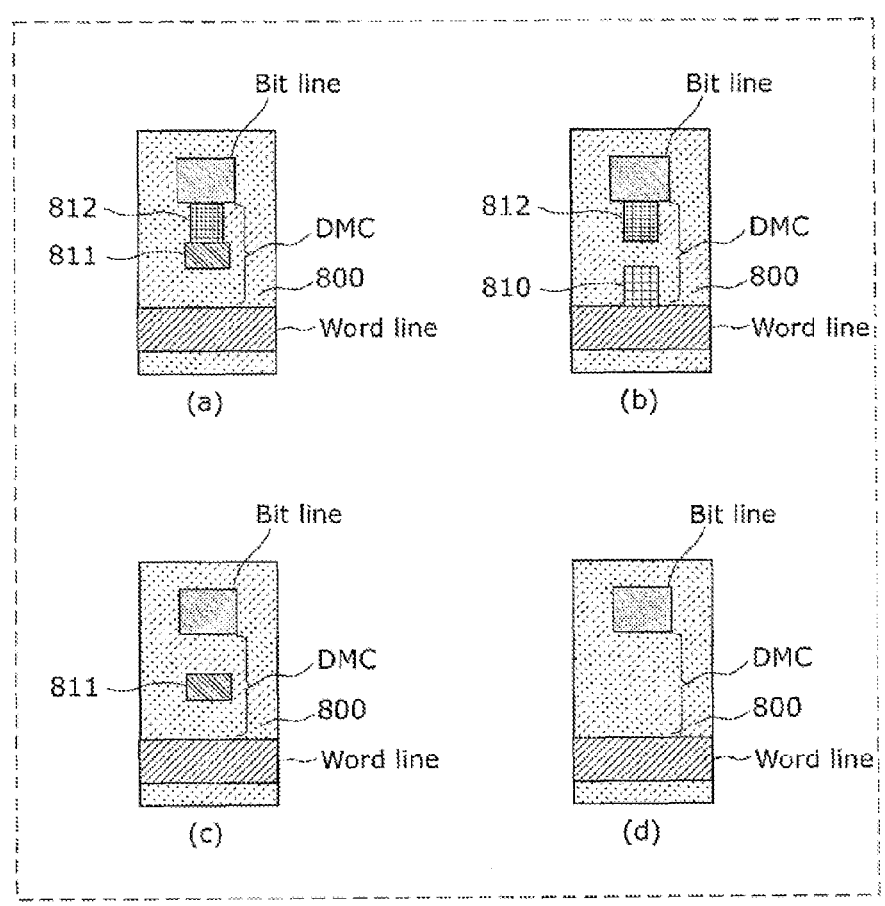
FIG. 6 illustrates cross-sectional views for explaining other configurations of the offset detection cell of the present invention.

Other structural examples of the offset detection cell DMC are illustrated in (a) to (d) in FIG. 6. In contrast to the structure of the memory cell MC, the offset detection cell DMC of (a) in FIG. 6 has a structure in which a via for electrically connecting the memory element 811 and the word line is not formed. The offset detection cell DMC of (b) in FIG. 6 has a structure in which the memory element 811 is not formed. The offset detection cell DMC in (c) in FIG. 6 has a structure in which both vias for electrically connecting the memory element 811 to the word line and the dummy bit line are not formed. The offset detection cell DMC of (d) in FIG. 6 has a structure in which the memory element and both upper and lower vias are not formed. With any of the above structures, almost no current flows through the offset detection cell DMC even when a potential difference at the time of reading is applied between the word line and dummy bit line below and above the offset detection cell DMC, and thus the effect similar to that of the offset detection cell DMC illustrated in FIG. 5 is obtained.

In contrast to the structure of the offset detection cell DMC illustrated in FIG. 5, each of the structures of the offset detection cell DMC in (a), 6(b), (c) in FIG. 6 has an effect that the offset detection cell DMC has a less chance of short circuit even when over-etching occurs when a bit line is formed by copper (Cu) damascene wiring and a wiring groove for the bit line is formed.

In addition, with the structure of (b) in FIG. 6, even when the first via 810 is composed of tungsten (W) via or Cu via, dishing amount of the offset detection cell DMC can be equal to that of the memory cell MC, and thus an effect is obtained that a variation in local focus margin can be reduced in lithography process of the memory element 811. In addition, with the structure of (c) in FIG. 6, vias are not formed above and below the memory element 811 and thus even when over-etching occurs in the via etch, the offset detection cell DMC is not short-circuited. Additionally, the structure of (d) in FIG. 6 provides the highest probability of preventing a short circuit of the offset detection cell DMC due to a variation in the manufacturing process.

Figure 7:
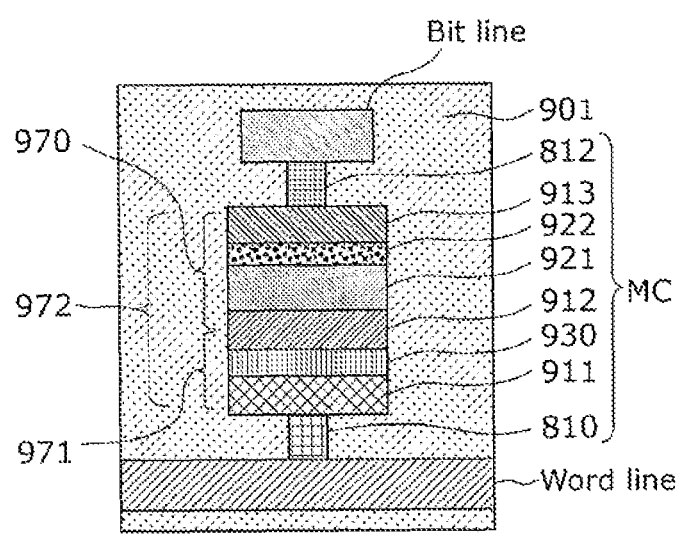
FIG. 7 is a cross-sectional view of a memory cell of the present invention when the memory cell is configured with a ReRAM and a MSM diode.

FIG. 7 illustrates an example of the configuration of the memory cell MC in the case where a variable resistance element (ReRAM) is used as the variable resistance memory element of the memory element 811, and an MSM diode is used as the switching element.

As illustrated in FIG. 7, a variable resistance element 970 has a stacked layer structure having a second electrode 912, a high oxygen-deficient layer (low concentration oxide layer) 921, a low oxygen-deficient layer (high concentration oxide layer) 922, and a third electrode 913. A diode 971 has a stacked layer structure comprising a first electrode 911, a semiconductor layer 930, and a second electrode 912. In the memory element 972 illustrated in FIG. 7, the second electrode 912 is shared by both the variable resistance element 970 and the diode 971. However, when different materials are needed for the variable resistance element 970 and the diode 971, the second electrode 912 may be formed in a stacked layer structure comprising at least two layers composed of different materials.

TaN (tantalum nitride), TiN (titanium nitride), or W (tungsten) may be used as the material of the first electrode 911 and the second electrode 912. Here, TaN having a thickness of 50 nm is used.

Either one of Pt (platinum), Ir (iridium) and Pd (palladium) or alloy of these materials may be used as the material of the third electrode 913. Here, Ir having a thickness of 50 nm is used.

The high oxygen-deficient layer 921 and the low oxygen-deficient layer 922 constitute a variable resistance layer of the variable resistance element 970. The resistance change in the variable resistance element 970 occurs by a change in the resistance of the variable resistance layer.

An oxygen-deficient film is used as the high oxygen-deficient layer 921, the oxygen-deficient film being an oxide with an oxygen content less in the atomic ratio than that of an oxide with a stoichiometric composition. The high oxygen-deficient layer 921 preferably has a range of oxygen content such that $TaO_x$ ($0<x<2.5$). The film thickness is preferably 30 nm or greater and 100 nm or less.

The low oxygen-deficient layer 922 is preferably expressed as $TaO_y$ ($x<y\leq2.5$), and the film thickness is preferably 1 nm or greater and 10 nm or less. The value of x in the chemical formula TaOx can be adjusted by controlled the ratio of an oxygen gas flow to an argon gas flow at the time of sputtering.

Hereinafter, specific process at the time of sputtering will be described. First, a substrate is installed in a sputtering device, and vacuum suction is applied to the inside space of the sputtering device to achieve $7\times10^{-4}$ Pa. Then sputtering is performed on tantalum as a target under the condition that power is 250 W, the pressure of a gas mixture of argon gas and oxygen gas is 3.3 Pa, and the temperature of the substrate is set at 30° C. When an oxygen partial pressure ratio is changed from 1% to 7%, the oxygen content ratio in the tantalum oxide layer (i.e., the composition ratio of oxygen atoms to the total atoms (O/(Ta+O)) is changed from approximately 40% ($TaO_{0.66}$) to approximately 70% ($TaO_{2.3}$). The composition of the tantalum oxide layer can be measured using the Rutherford backscattering spectrometry. Here, the oxide with a stoichiometric composition herein indicates $Ta_2O_5$ which is an insulator in the case of tantalum oxide. When a metal oxide is caused to be oxygen-deficient, the metal oxide becomes conductive. In the present embodiment, $Ta_2O_5$ film is deposited up to 6 nm as the low oxygen-deficient layer 922, and $TaO_{0.66}$ is deposited up to 50 nm as the high oxygen-deficient layer 921.

In addition to an oxygen-deficient tantalum oxide film, an oxide film containing oxygen-deficient iron or other transition metal oxides including an oxide such as hafnium (Hf), zirconium (Zr), titanium (Ti), niobium (Nb), tungsten (W) may also be used as the low oxygen-deficient layer 922 and the high oxygen-deficient layer 921 similarly, so that a variable resistance layer in a similar stacked layer structure can be formed. The sputtering method, CVD method, or the like is used as the film deposition method for the above-mentioned films.

In the present embodiment, the degree of oxygen deficiency of the low oxygen-deficient layer 922 is lower than that of the high oxygen-deficient layer 921. Here, the degree of oxygen deficiency indicates the ratio of deficient oxygen to the amount of oxygen contained in the oxide with the stoichiometric composition in each transition metal. For example, in the case where the transition metal is tantalum (Ta), the composition of the oxide with the stoichiometric composition is $Ta_2O_5$ and can be expressed as $TaO_{2.5}$. The degree of oxygen deficiency of $TaO_{2.5}$ is 0%. The degree of oxygen deficiency of an oxygen-deficient tantalum oxide with a composition of $TaO_{1.5}$ is as follows:

Degree of oxygen deficiency=(2.5−1.5)/2.5=40%,

Because the transition metal can be in any of a plurality of oxidation states, different resistance states can be achieved by oxidation reduction reactions. For example, when hafnium oxides are used under the assumption that the composition of the high oxygen-deficient layer 921 is $HfO_x$ where x is 0.9 or greater and 1.6 or less, and the composition of the low oxygen-deficient layer 922 is $HfO_y$ where y is greater than the value of x, it has been verified that the resistance value of the variable resistance layer is caused to change stably and quickly. In this case, the film thickness of the low oxygen-deficient layer 922 is preferably 3 nm or greater and 4 nm or less. When zirconium oxides are used under the assumption that the composition of the high oxygen-deficient layer 921 is $ZrO_x$ where x is 0.9 or greater and 1.4 or less, and the composition of the low oxygen-deficient layer 922 is $ZrO_y$ where y is greater than the value of x, it has been verified that the resistance value of the variable resistance layer is caused to change stably and quickly. In this case, the film thickness of the low oxygen-deficient layer 922 is preferably 1 nm or greater and 5 nm or less. As described above, by constituting the variable resistance layer with the low oxygen-deficient layer 922 having a high resistance and a thin film thickness and the high oxygen-deficient layer 921 having a low resistance, majority of the voltage applied to the variable resistance element is distributed to the low oxygen-deficient layer 922 having a high resistance, and thus an oxidation reduction reaction in the low oxygen-deficient layer 922 is likely to occur.

For a first transition metal constituting part of the high oxygen-deficient layer 921 and a second transition metal constituting part of the low oxygen-deficient layer 922, different materials may be used. In this case, the low oxygen-deficient layer 922 preferably has a degree of oxygen deficiency lower than that of the high oxygen-deficient layer 921, i.e., preferably has a resistance higher than that of the high oxygen-deficient layer 921. With such a configuration, majority of the voltage applied to the variable resistance layer at the time of a resistance change is distributed to the low oxygen-deficient layer 922, and thus an oxidation reduction reaction in the low oxygen-deficient layer 922 is likely to occur. When the materials used in the first transition metal and the second transition metal are different from each other, the standard electrode potential of the second transition metal is preferably lower than that of the first transition metal. Resistance change phenomenon probably occurs by the following mechanism. An oxidation reduction reaction occurs in a tiny filament formed in the low oxygen-deficient layer 922 having a high resistance, and thus the resistance value changes. For example, a stable operation of resistance change is achieved by using an oxygen-deficient tantalum oxide in the high oxygen-deficient layer 921, and using titanium oxide ($TiO_2$) in the low oxygen-deficient layer 922. Titanium (standard electrode potential=−1.63 eV) is a material with a standard electrode potential lower than that of Tantalum (standard electrode potential=−0.6 eV). The standard electrode potential indicates characteristics such that higher the value of standard electrode potential, more resistant to oxidizing. By disposing a metal oxide in the low oxygen-deficient layer 922, the metal oxide having a standard electrode potential lower than that of the high oxygen-deficient layer 921, an oxidation reduction reaction in the low oxygen-deficient layer 922 is likely to occur.

Nitrogen-deficient silicon nitride (SiNx) is used as the material of the semiconductor layer 930. $SiN_K$ film having such semiconductor characteristics can be formed by reactive sputtering using Si target in a nitrogen gas atmosphere, for example. For example, $SiN_x$ film may be produced in an environment where the temperature is ambient, the pressure of a chamber is in a range of 0.1 to 1 Pa, and $Ar/N_2$ flow rate is 18 sccm/2 sccm.

When SiNx having the semiconductor characteristics was produced with a thickness of 16 nm in the above conditions, a current density of $2.5 \times 10^3$ A/cm² was obtained under application of voltage 1.6 V, and a current density of $5 \times 10^2$ A/cm² was obtained under application of voltage 0.8 V. Thus, when these voltages were used as reference voltages, the on/off ratio of current was 5, and thus is has been verified that the above $SiN_x$ can well serve as the diode element included in the memory element 972.

W was used as the material of the first via 819 and the second via 812.

As an interlayer insulating film 901, a TEOS-SiO film, a silicon nitride (SiN) film, a silicon carbon nitride (SiCN) or silicon oxycarbide (SiOC) film which is a low dielectric constant material, a fluorinated silicon oxide (SiOF) film, or the like may be used. Furthermore, a stacked layer structure of these materials may be used. Here, a TEOS-SiO film was used.

Cu (copper) wiring or Al—Cu (aluminum copper alloy) wiring, each of which is used in typical semiconductors may be used in the word lines and bit lines (and dummy bit line). Here, Al—Cu wiring was used.

In the variable resistance element 970 produced based on the above-described configuration, the resistance value (initial resistance) immediately after manufacture is higher than the resistance value in a high resistance (HR) state at the time of a normal resistance change operation. In order to set an element in a non-operating state (a state in which a memory operation is not performed) after manufacture into a state which allows a resistance change operation (memory operation), forming operation (an operation which creates a state (generally, low resistance state) which allows a memory operation, by applying a voltage higher than the application voltage at the time of a normal resistance change operation) is necessary.

A variable resistance element to be used as the memory cell MC for storing data needs to undergo forming operation, however, when forming operation is not performed on a certain variable resistance element intentionally, the memory cell MC containing the certain variable resistance element can be used as an offset detection cell. Thus, when the variable resistance element 970 in FIG. 7 is used, the memory cell MC and the offset detection cell DMC can be selectively produced depending on the application of forming operation. That is to say, the memory cell MC may be a cell which has undergone the forming operation after manufacture for allowing the memory element to perform a memory operation. On the other hand, the offset detection cell DMC may be a cell which has the same structure as that of the memory cell MC, and has not undergone the forming operation after manufacture. Thus, it is possible to select which cell is to be used as the offset detection cell DMC after manufacture, and therefore, there is an advantage in that the degree of freedom in circuit design increases. In addition, the memory cell MC and the offset detection cell DMC have no difference in their manufacturing processes, and thus an influence on the dimensions of completed pieces due to a difference in the conventional layout of the memory cell MC and the offset detection cell DMC can be eliminated.

Next, a nonvolatile semiconductor memory device to which the above-described offset detection cell array is applied will be described.

[First Embodiment]

Figure 8:
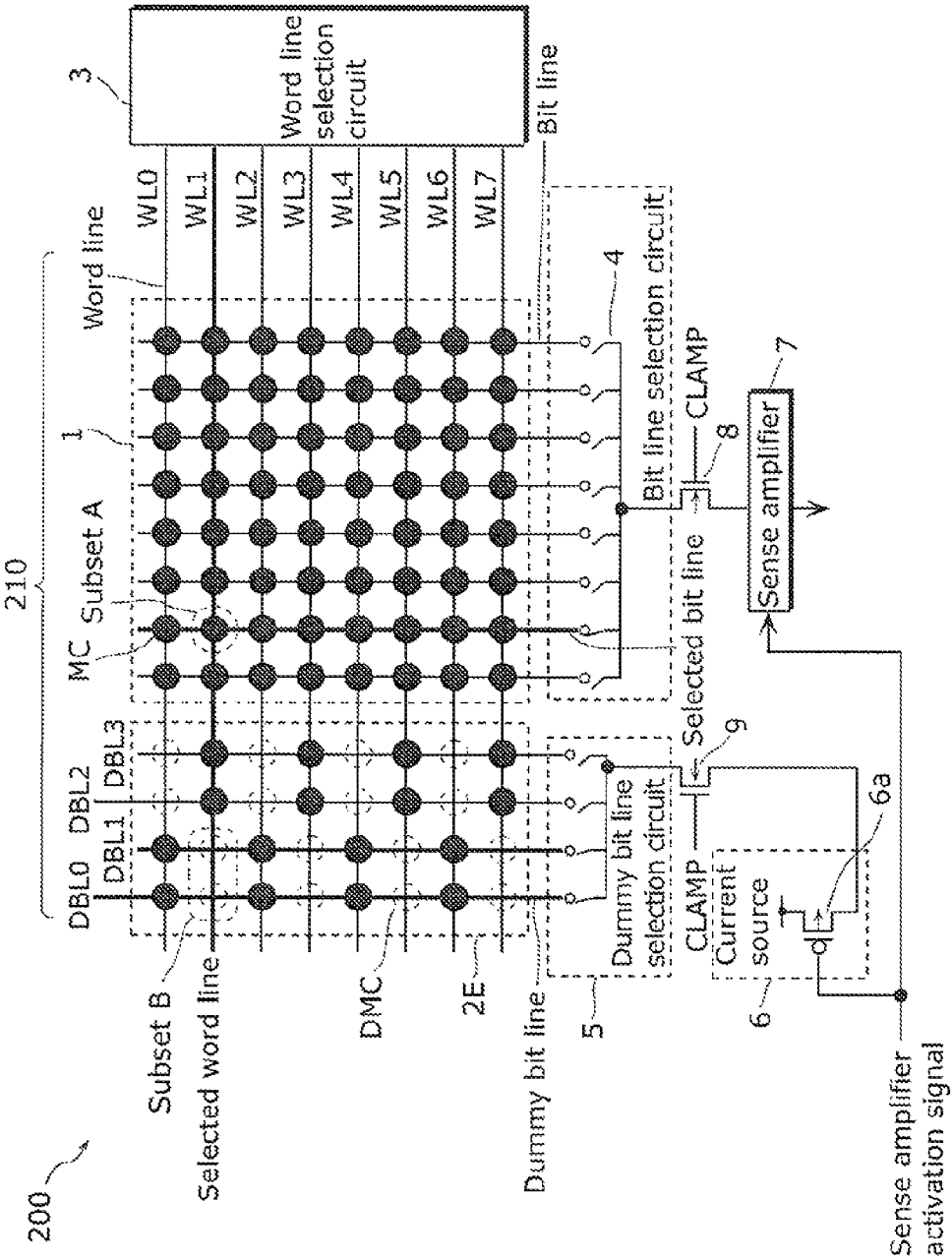
FIG. 8 is a schematic circuit diagram of a nonvolatile semiconductor memory according to a first embodiment of the present invention.

FIG. 8 is a block diagram illustrating the circuit configuration of a nonvolatile semiconductor memory device 200 in a first embodiment of the present invention.

The nonvolatile semiconductor memory device 200 includes the following configuration as the main components. The nonvolatile semiconductor memory device 200 includes word lines WL0 to WL7 formed in parallel in a first plane; bit lines formed in parallel in a second plane and three-dimensionally crossing the word lines WL0 to WL7, the second plane being parallel to the first plane; and a first cross-point cell array (cross-point cell array 1) including first type cells (memory cells) located at three-dimensional cross-points of the word lines WL0 to WL7 and the bit lines. The nonvolatile semiconductor memory device 200 further includes one or more dummy bit lines (here, four dummy bit lines DBL0 to DBL3) formed in parallel and three-dimensionally crossing the word lines WL0 to WL7 in the second plane; and a second cross-point cell array (offset detection cell array 2E) including cells, each of which is either the first type cell (memory cell) or a second type cell (offset detection cell), located at a corresponding one of three-dimensional cross-points of the word lines WL0 to WL7 and the one or more dummy bit lines DBL0 to DBL3, each of the one or more dummy bit lines DBL0 to DBL3 having at least one each of the first type cells (memory cells) and the second type cells (offset detection cells). The nonvolatile semiconductor memory device 200 further includes a word line selection circuit 3 that selects one of the word lines WL0 to WL7 as a selected word line; a bit line selection circuit 4 that selects one of the bit lines as a selected bit line; and a dummy bit line selection circuit 5 that selects at least one of the one or more dummy bit lines (here, four dummy bit lines DBL0 to DBL3) as a selected dummy bit line. In addition, the nonvolatile semiconductor memory device 200 includes a read circuit (such as a sense amplifier) that applies a predetermined voltage via the selected word line and the selected bit line to a selected cell which is a corresponding first type cell (memory cell) in the first cross-point cell array (cross-point cell array 1), and determines a resistance state of the selected cell based on a current which flows through the selected bit line; and a current source that supplies a current to the second cross-point cell array (offset detection cell array 2E) via the selected dummy bit line in a period of a read operation performed by the read circuit (such as a sense amplifier).

The first type cell includes a variable resistance element that operates as a memory by reversibly changing between at least two resistance states based on an electrical signal applied between a corresponding one of the word lines and a corresponding one of the bit lines, the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is a state of the variable resistance element when operating as the memory.

The dummy bit line selection circuit 5 selects, as the selected dummy bit line, a dummy bit line such that the second type cell (offset detection cell) is disposed at a three-dimensional cross-point of the selected dummy bit line and the selected word line, in a period of a read operation performed by the read circuit (such as a sense amplifier). Hereinafter, the components of the nonvolatile semiconductor memory device 200 will be described in detail.

The cross-point cell array 1 is the same as what has been described with reference to FIG. 19, and is a memory cell array with M rows and N columns (8 rows and 8 columns here in) which is a target for writing and reading.

An offset detection cell array 2E is disposed adjacent to the cross-point cell array 1 with the word lines shared by both arrays. Four dummy bit lines DBL0 to DBL3 are arranged on the offset detection cell array 2E in the column direction. That is to say, the dummy bit lines are constituted by the dummy bit lines DBL2, DBL3 having offset detection cells DMC at the three-dimensional cross-points with even-numbered word lines WL0, WL2, WL4 and the dummy bit lines DBL0, DBL1 having offset detection cells DMC at the three-dimensional cross-points with odd-numbered word lines WL1, WL3, WL5 . . .

The bit line group of the cross-point cell array 1 is connected to a sense amplifier 7 via a bit line selection circuit 4 and a clamp circuit 8 comprising an N-type MOS transistor having a gate as a node CLAMP.

The dummy bit lines DBL0 to DBL3 of the offset detection cell array 2E is connected to a current source 6 via a bit line selection circuit 5 and a clamp circuit 9 comprising an N-type MOS transistor having a gate as a node CLAMP. The current source 6 comprises a P-type MOS transistor 6a. A sense activation signal for activating the sense amplifier 7 is inputted to the gate of the P-type MOS transistor 6a and the sense amplifier 7.

The cross-point cell array 1 and the offset detection cell array 2E constitute a cross-point cell gray block 210.

The read operation of the nonvolatile semiconductor memory device 200 configured in the above manner will be described.

In a read operation performed on the cross-point cell array 1, a word line is selected by a word line selection circuit 3, and a bit line is selected by a bit line selection circuit 4. The sense amplifier 7 is then activated by a command of a sense activation signal, and a read operation is performed by the sense amplifier 7 detecting a current which flows from the sense amplifier 7 to the memory cell MC located at the three-dimensional cross-point area A on the selected bit line and the selected word line.

At the same time, the P-channel MOS transistor 6a of the current source 6 is also turned on by the command of the sense activation signal, so that a current is supplied to the offset detection cell array 2E.

Then, for example, when the word line WL1 is designated and the memory cell MC at the three-dimensional cross-point area A is selected as a memory cell of the cross-point cell array 1, selection of a dummy bit line by the dummy bit line selection circuit 5 is controlled in such a manner that the dummy-bit line DBL0 and the dummy bit line DBL1 corresponding to the offset detection cells DMC (a three-dimensional cross-point area B) that are disposed on the selected word line WL1 are selected. That is to say, when the odd-numbered word lines WL1, WL3, WL5, . . . are selected, the dummy bit line DBL0 and the dummy bit line DBL1 are selected, and when the even-numbered word lines WL0, WL2, WL4, . . . are selected, the dummy bit line DBL2 and the dummy bit line DBL3 are selected.

The clamp circuit 8 and the clamp circuit 9 prevent an erroneous writing (disturb) due to an increase of the voltage of the bit lines and the voltage of the dummy bit lines up to a predetermined voltage or higher at the time of a read operation, and thus the voltage of the bit lines and the voltage of the dummy bit lines are controlled up to a voltage equal to the voltage of the node CLAMP reduced by a threshold voltage of the N-type MOS transistor.

Figure 9:
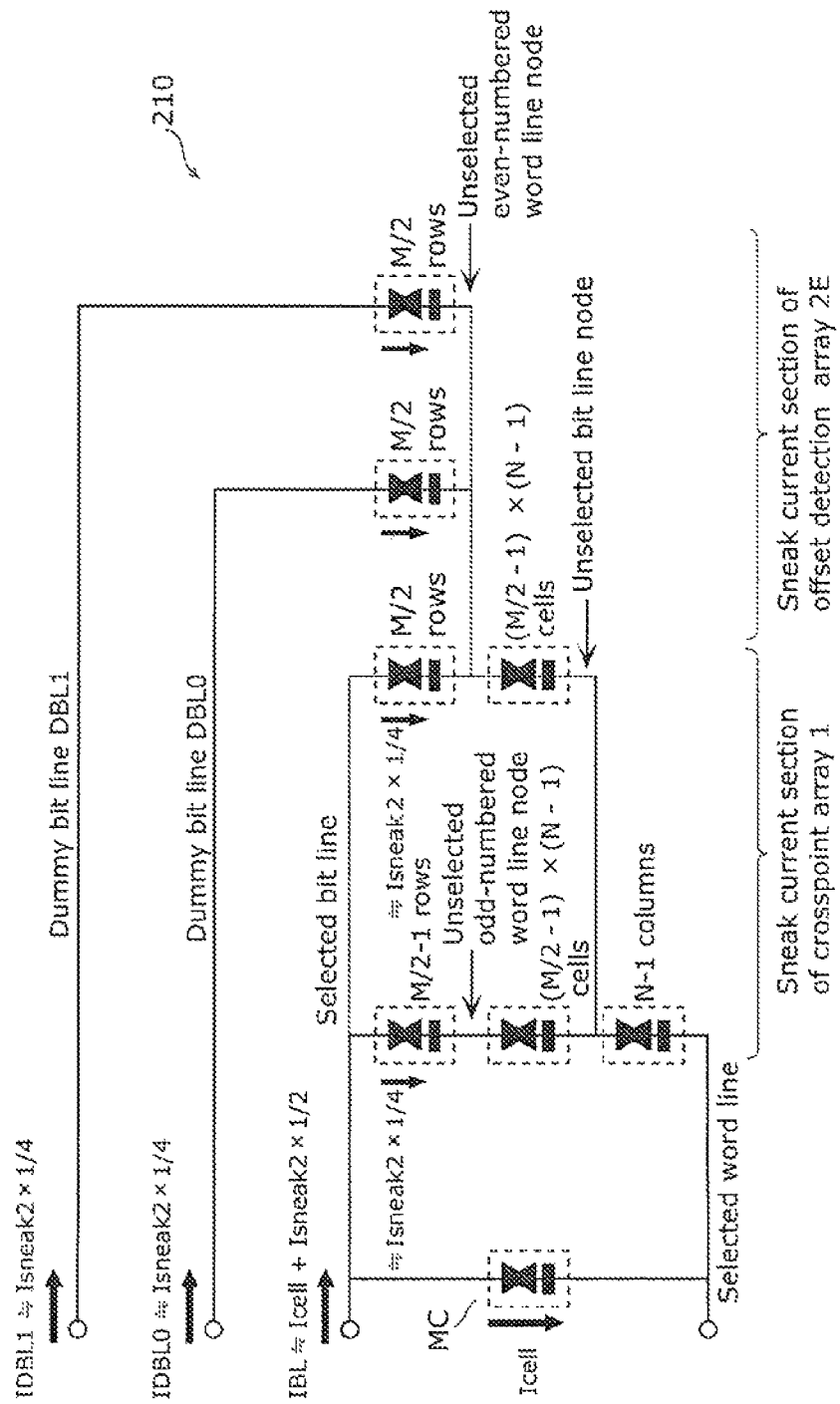
FIG. 9 is an equivalent circuit diagram of a cross-point cell array block according to the first embodiment of the present invention.

FIG. 9 is a simplified equivalent circuit diagram illustrating the impedance of the cross-point cell array block 210 included in the nonvolatile semiconductor memory device 200 when the memory cell located at the three-dimensional cross-point area A is selected. The point of difference from the equivalent circuit diagram described with reference to FIG. 3 will be described, and the point in common will be described briefly.

First, in a read operation, a predetermined voltage is applied between a selected bit line and a selected word line via the clamp circuit 8, while the same voltage is also is applied to the dummy bit line DBL0 and the dummy bit line DBL1 by the clamp circuit 9. At this moment, unselected word lines, unselected bit lines, the unselected dummy bit line DBL2 and the unselected dummy bit line DBL3 are set in an open state.

The path of the sneak current is divided into two paths: a path having the cross-point cell array 1 as the current inflow portion, and another path having the offset detection cell array 2E as the current inflow portion. The sneak current path from the offset detection cell array 2E is further divided into two paths: the selected dummy bit line DBL0 and the selected dummy bit line DBL1. Because the respective current inflow portions are only the three-dimensional cross-points of the selected dummy bit line DBL0, DBL1, and the even-numbered word lines, the sneak current flows in from respective M/2 unselected memory cells, and merges with the sneak current of the cross-point cell array 1 at unselected even-numbered word line nodes, and further merges with the sneak current from unselected odd-numbered word lines (unselected odd-numbered word line nodes) via unselected bit line nodes, and flows out to the selected word line.

In the equivalent circuit illustrated in FIG. 9, the impedance of the middle stage of the sneak current path is determined depending on the product of (M/2 pieces) in the upper stage and (N−1 piece) in the lower stage, and thus is low and the impedance of the entire system is mainly determined by the upper stage and the lower stage.

Therefore, under the assumption that Icell is the current which flows through the selected memory cell, Isneak2 is the sneak current of the entire system, IDBL0 is the current which flows through the dummy bit line DBL0, and IDBL1 is the current which flows through the dummy bit line DBL1, current IBL which flows from the selected bit line of the cross-point cell array block 210 to the selected word line, and current IDBL which flows from the current source 6 to the selected word line can be generally expressed as follows.

$$IBL = Icell + Isneak2/2 \quad \text{(Expression 3)}$$

$$IDBL = IDBL0 + IDBL1 = 2 \times Isneak2/4 = Isneak2/2 \quad \text{(Expression 4)}$$

That is to say, as described in the paragraph of the basic principle, by applying a predetermined current to the unselected word lines from the current source 6 via the dummy bit line, the sneak current which flows out from the selected bit line is reduced by half when observed from the sense amplifier 7, and thus S/N can be increased, and the read performance is stabilized.

In the present embodiment, the offset detection cell array 2E has a configuration such that two pieces of the same dummy bit line are provided for the even-numbered word lines as well as the odd-numbered word lines. However, by adopting a configuration such that the application voltage at the current source 6 and the gate voltage of the clamp circuit 9 are slightly increased, for example, the amount of current supply is increased, and thus the number of dummy bit lines for each numbered word lines may be reduced from two to one.

When the memory cells MC disposed in the offset detection cell array 2E are set in a low resistance state, the sneak current supplied from the dummy bit line further increases, and the sneak current of the selected bit line can be relatively reduced, and thus S/N can be further increased.

Figure 10:
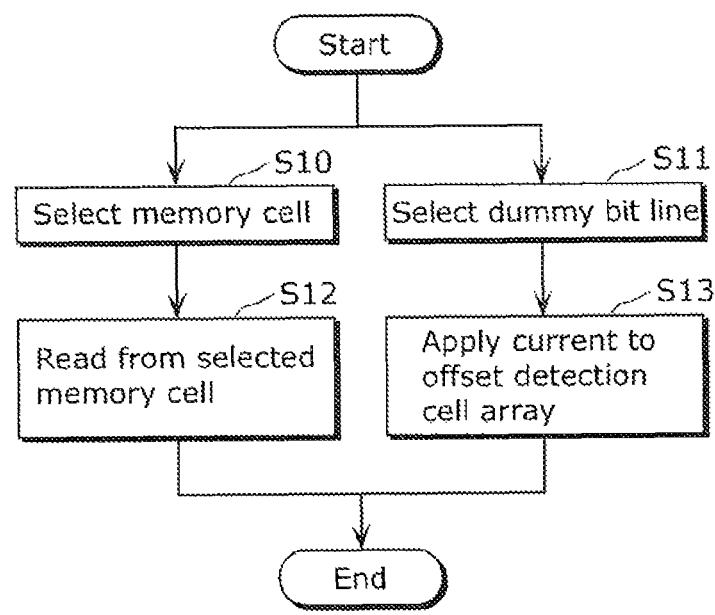
FIG. 10 is a flowchart illustrating a read method performed by the nonvolatile semiconductor memory according to the first embodiment of the present invention.

The read operation described above is summarized in the steps of the flowchart illustrated in FIG. 10.

That is to say, in the read method performed by the nonvolatile semiconductor memory device 200 in the present embodiment, first, one word line is selected from a plurality of word lines WL0 to WL7 as a selected word line by the word line selection circuit 3, and one bit is line is selected from a plurality of bit lines as a selected bit line by the bit line selection circuit 4 (memory cell selection step S10).

At the same time (concurrently), at least one dummy bit line is selected as a selected dummy bit line from one or more dummy bit lines by the dummy bit line selection circuit 5 (dummy bit line selection step S11). In dummy bit line selection step S11, the dummy bit line on which the second type cell (offset detection cell) is disposed at the three-dimensional cross-point of the selected word line and the selected dummy bit line is selected as a selected dummy bit line in a period of the read operation performed in the subsequent read step S12.

Subsequent to memory cell selection step S10, a predetermined voltage is applied to a selected memory cell by the sense amplifier 7 via the selected word line and the selected bit line so as to determine a resistance state of the selected memory cell based on the current which flows through the selected bit line, the selected memory cell corresponding to the first type cell (memory cell) in a first cross-point cell array (cross-point cell array 1) (read step S12).

Then concurrently with the above-described read step S12 subsequent to dummy bit line selection step S11, i.e., in a period of the read operation in read step S12, a current is supplied to the second cross-point cell array by the current source 6 via the selected dummy bit line (current application step S13).

By such a read method, a predetermined current is applied to unselected word lines by the current source 6 via the dummy bit line in the period of reading from the memory cell, and thus the sneak current which flows out from the selected bit line is reduced by half when observed from the sense amplifier 7, and the S/N in reading the memory cell increases, thereby stabilizing the read performance.

[Second Embodiment]

Figure 11:
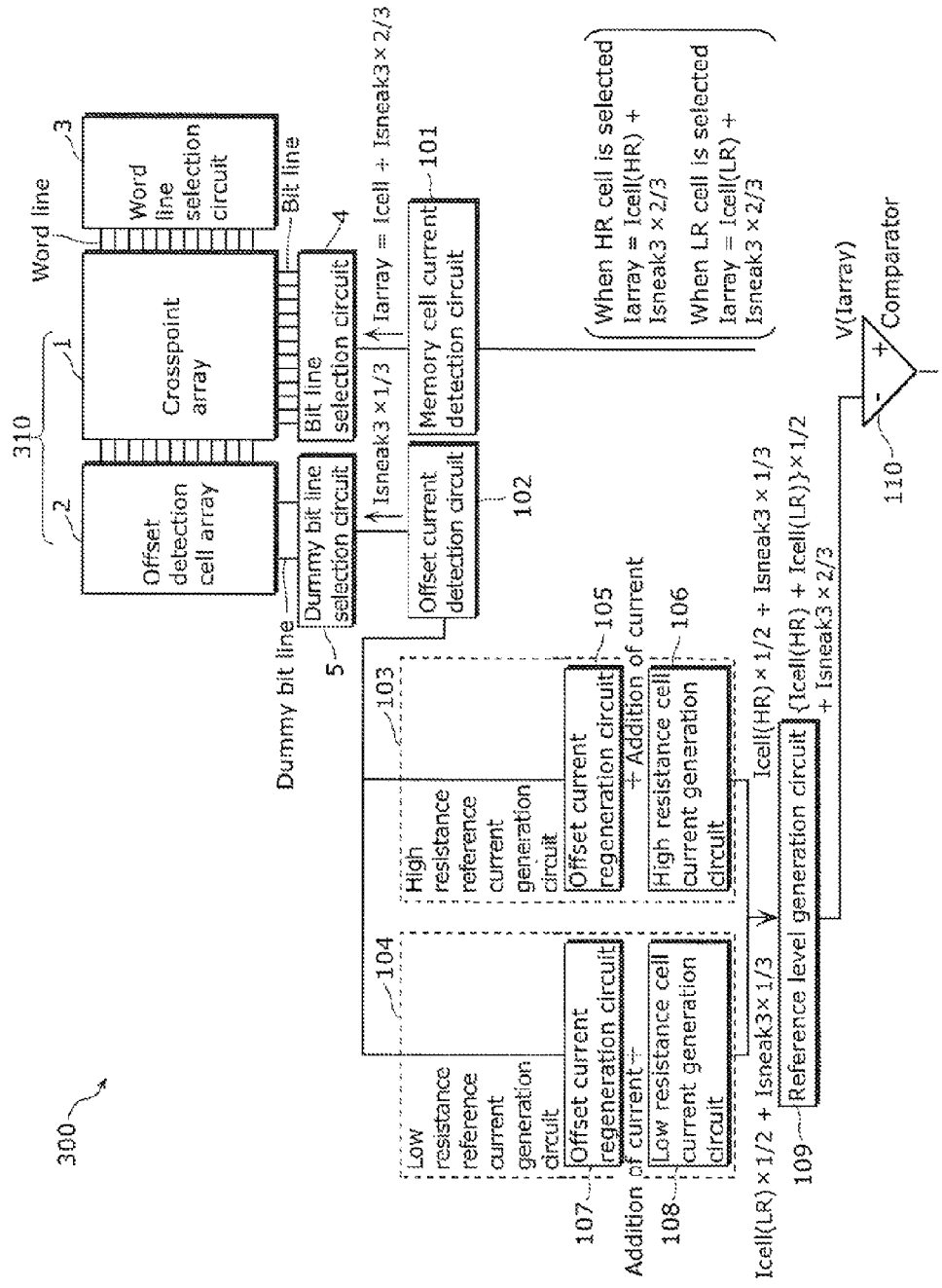
FIG. 11 is a schematic circuit block diagram of a nonvolatile semiconductor memory device according to a second embodiment of the present invention.

FIG. 11 is a block diagram illustrating the circuit configuration of a nonvolatile semiconductor memory device 300 in a second embodiment of the present invention. The nonvolatile semiconductor memory device 300 generates a determination level of the sense amplifier with high accuracy by utilizing the result that the current which flows through the dummy bit line corresponds to the sneak current in Expression 2.

The nonvolatile semiconductor memory device 300 includes the following configuration as the main components. That is to say, similarly to the nonvolatile semiconductor memory device 200 of FIG. 8, the nonvolatile semiconductor memory device 300 includes word lines WL0 to WL7 formed in parallel in a first plane; bit lines formed in parallel in a second plane and three-dimensionally crossing the word lines WL0 to WL7, the second plane being parallel to the first plane; a first cross-point cell array (cross-point cell array 1)

including first type cells (memory cells) located at three-dimensional cross-points of the word lines WL0 to WL7 and the bit lines. The nonvolatile semiconductor memory device 300 further includes one or more dummy bit lines (here, four dummy bit lines DBL0 to DBL3) formed in parallel and three-dimensionally crossing the word lines WL0 to WL7 in the second plane; and a second cross-point cell array (offset detection cell array 2) including cells, each of which is either the first type cell (normal memory cell) or a second type cell (offset detection cell), located at a corresponding one of three-dimensional cross-points of the word lines WL0 to WL7 and the one or more dummy bit lines DBL0 to DBL3, each of the one or more dummy bit lines DBL0 to DBL3 having at least one each of the first type cells (normal memory cells) and the second type cells (offset detection cells). The nonvolatile semiconductor memory device 300 further includes a word line selection circuit 3 that selects one of the word lines WL0 to WL7 as a selected word line; a bit line selection circuit 4 that selects one of the bit lines as a selected bit line; and a dummy bit line selection circuit 5 that selects at least one of the one or more dummy bit lines (here, four dummy bit lines DBL0 to DBL3) as a selected dummy bit line. In addition, the nonvolatile semiconductor memory device 300 includes a read circuit (memory cell current detection circuit 101, comparator 110) that applies a predetermined voltage via the selected word line and the selected bit line to a selected cell which is a corresponding first type cell (memory cell) in the first cross-point cell array (first cross-point cell array 1), and determines a resistance state of the selected cell based on a current which flows through the selected bit line; and a current detection circuit (offset current detection circuit 102) that detects a current which flows through the second cross-point cell array (offset detection cell array 2) via the selected dummy bit line in a period of a read operation performed by the read circuit (memory cell current detection circuit 101, comparator 110). The read circuit (particularly, the comparator 110) determines a resistance state of the selected cell based on a value corresponding to the current which flows through the selected bit line, and a value (reference level) according to a current which flows through the second cross-point cell array (the offset detection cell array 2).

In the present embodiment, the nonvolatile semiconductor memory device 300 further includes the following first to fourth circuits in order to generate the above-mentioned reference level. The first circuit is an offset current detection circuit 102 that detects a current which flows through the dummy bit line and amplifies the detected current by X times. The second circuit is a first current summing circuit (high resistance reference current generation circuit 103) which comprises the first type cells (normal memory cells) that generates a first summed current which is the sum of a current which flows through the reference cells which are set in a first resistance state (high resistance state herein) out of at least two resistance states, and a current obtained by amplifying the current flowing through the dummy bit line by X times. The third circuit is a second current summing circuit (low resistance reference current generation circuit 103) which comprises the first type cells (normal memory cells), and is configured to generate a second summed current which is the sum of a current which flows through the reference cells which are set in a second resistance state (low resistance state herein) out of at least two resistance states, and a current obtained by amplifying the current flowing through the dummy bit line by X times. The fourth circuit is a reference level generation circuit 109 that sums (adds) up and average the first and second summed currents, and generates a reference level which is a voltage corresponding to the summed and averaged current.

The read circuit (particularly, the comparator 110) then determines a resistance state of the selected cell based on a criterion with a value of a reference level (i.e., the average value of the first summed current and the second summed current) generated by the reference level generation circuit 109.

Hereinafter, the components of the nonvolatile semiconductor memory device 300 will be described in detail.

The following components have the same configuration as described above: the cross-point cell array 1 and the offset detection cell array 2 which share the word lines, the word line selection circuit 3, the bit line selection circuit 4 that selects a bit line of the cross-point cell array 1, the dummy bit line selection circuit 5 that selects a dummy bit line of the offset detection cell array 2. The offset detection cell array 2 may have the configuration of any one of the offset detection cell arrays 2B to 2D illustrated in FIG. 4.

The output of the bit line selection circuit 4 is connected to the memory cell current detection circuit 101, and is inputted into a first input terminal of the comparator 110.

The output of the dummy bit line selection circuit 5 is connected to the offset current detection circuit 102, and is inputted to the high resistance reference current generation circuit 103 and the low resistance reference current generation circuit 104. The high resistance reference current generation circuit 103 comprises an offset current regenerative circuit 105 and a high resistance cell current generation circuit 106, and generates a summed current obtained by summing the currents regenerated and generated by both circuits. The low resistance reference current generation circuit 104 comprises an offset current regenerative circuit 107 and low resistance cell current generation circuit 108, and generates a summed current which is obtained by summing the currents regenerated and generated by both circuits.

The output currents from the high resistance reference current generation circuit 103 and the low resistance reference current generation circuit 104 are summed and averaged to a nearly intermediate value of the output currents by the reference level generation circuit 109, so that a reference voltage is generated. The generated reference voltage is inputted to a second input terminal of the comparator.

Figure 12:
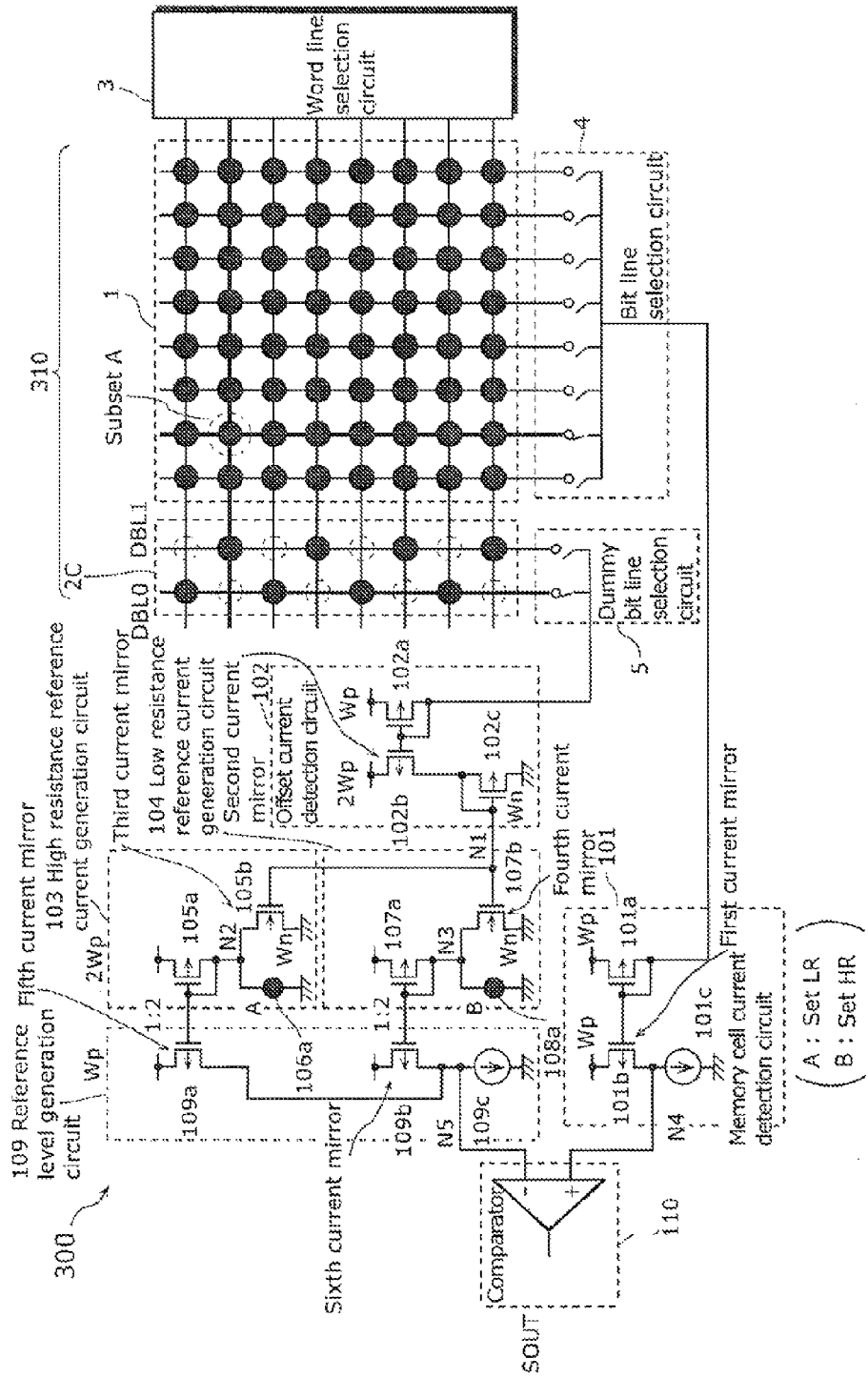
FIG. 12 is a schematic circuit diagram of the nonvolatile semiconductor memory device according to the second embodiment of the present invention.

FIG. 12 illustrates a specific circuit configuration of a circuit block of the nonvolatile semiconductor memory device 300 described with reference to FIG. 11. The offset detection cell array 2C described with reference to FIG. 4 serves as the offset detection cell array 2.

The memory cell current detection circuit 101 comprises a first current mirror circuit including a P-type MOS transistor 101*a* and a P-type MOS transistor 101*b*, and a constant current source 101*c*. A voltage determined by a mirror current in the first current mirror circuit is outputted to node N4 as an output of the memory cell current detection circuit.

The offset current detection circuit 102 comprises a second current mirror circuit including a P-type MOS transistor 102*a* and a P-type MOS transistor 102*b*, and an N-type MOS transistor 102*c*. Here, the N-type MOS transistor 102*c* constitutes part of third and fourth current mirror circuits between the next stage (the high resistance reference current generation circuit 103 and the low resistance reference current generation circuit 104) and the N-type MOS transistor 102*c*.

The high resistance reference current generation circuit 103 comprises a P-channel MOS transistor 105*a*, an N-type MOS transistor 105*b*, and a high resistance state reference cell 106a. The N-type MOS transistor 105b corresponds to the offset current regenerative circuit 105 in FIG. 11, the high resistance state reference cell 106a corresponds to the high resistance cell current generation circuit 106 in FIG. 11, and the P-channel MOS transistor 105a corresponds to a circuit which generates a summed current obtained by summing the currents regenerated and generated by both circuits. Here, the gate of the N-type MOS transistor 105b is connected to node N1 of the gate and drain of the N-type MOS transistor 102c, and constitutes part of a third current mirror circuit.

The high resistance state reference cell 106a illustrated by a black circle comprises a memory cell in the same structure as that of the memory cell MC, and set in a high resistance state. The N-type MOS transistor 105b and the high resistance state reference cell 106a are connected in parallel between node N2 and the ground. Node N2 is connected to the gate and drain of the P-type MOS transistor 105a. Thus, the P-type MOS transistor 105a generates a summed current of the currents which flow through the N-type MOS transistor 105b and the high resistance state reference cell 106a, and constitutes part of a fifth current mirror circuit between the next stage (the reference level generation circuit 109) and the P-type MOS transistor 105a.

The low resistance reference current generation circuit 104 comprises a P-type MOS transistor 107a, an N-type MOS transistor 107b, and a low resistance state reference cell 108a. The N-type MOS transistor 107b corresponds to the offset current regenerative circuit 107 in FIG. 11, the low resistance state reference cell 108a corresponds to the low resistance cell current generation circuit 108 in FIG. 11, and the P-type MOS transistor 107a corresponds to a circuit which generates a summed current obtained by summing the currents regenerated and generated by both circuits. Here, the gate of the N-type MOS transistor 107b is connected to node N1 of the gate and drain of the N-type MOS transistor 102c, and constitutes part of the fourth current mirror circuit.

The low resistance state reference cell 108a illustrated by a black circle comprises a memory cell in the same structure as that of the memory cell MC, and set in a low resistance state. The N-type MOS transistor 107b and the low resistance state reference cell 108a are connected in parallel between node N3 and the ground. Node N3 is connected to the gate and drain of the P-type MOS transistor 107a. Thus, the P-type MOS transistor 107a generates a summed current of the currents which flow through the N-type MOS transistor 107b and the low resistance state reference cell 108a, and constitutes part of a sixth current mirror circuit between the next stage (the reference level generation circuit 109) and the P-type MOS transistor 107a.

The reference level generation circuit 109 comprises a P-type MOS transistor 109a, a P-type MOS transistor 109b, and a constant current source 109c having the same current supply characteristics as that of the constant current source 101c included in the memory cell current detection circuit 101.

The P-type MOS transistor 109a and the P-type MOS transistor 105a constitute the fifth current mirror circuit, and mirrors a high resistance reference current. The P-type MOS transistor 109b and the P-type MOS transistor 107a constitute the sixth current mirror circuit, and mirrors a low resistance reference current. A voltage determined by the summed current of the high resistance reference current and the low resistance reference current is then outputted to node N5 as an output of the reference level generation circuit 109.

The voltage at node N4 is compared with the voltage at node N5 by the comparator 110 for high/low determination, and the comparison result is outputted as read data SOUT.

The notation of Wp or its multiple, Wn or its multiple in the circuit diagram of FIG. 12 means the following. That is to say, Wp indicates the relative dimension of the channel width of the P-type MOS transistor, Wn indicates the relative dimension of the channel width of the N-type MOS transistor, Wp and Wn corresponding to the mirror ratios of respective current mirror circuits.

The respective mirror ratios are set as follows: the mirror ratio of the first current mirror circuit is 1:1, the mirror ratio of the second current mirror circuit is 1:2, the mirror ratio of the third and fourth current mirror circuit is 1:1, and the mirror ratio of the fifth and 6th current mirror circuit is 2:1.

The cross-point cell array 1 and the offset detection cell array 2 (or 2C) constitute a cross-point cell array block 310.

Next, the operation of the nonvolatile semiconductor memory device 300 configured in the above manner, and the reason for the setting of the mirror ratios of the current mirror circuits will be described.

Figure 13:
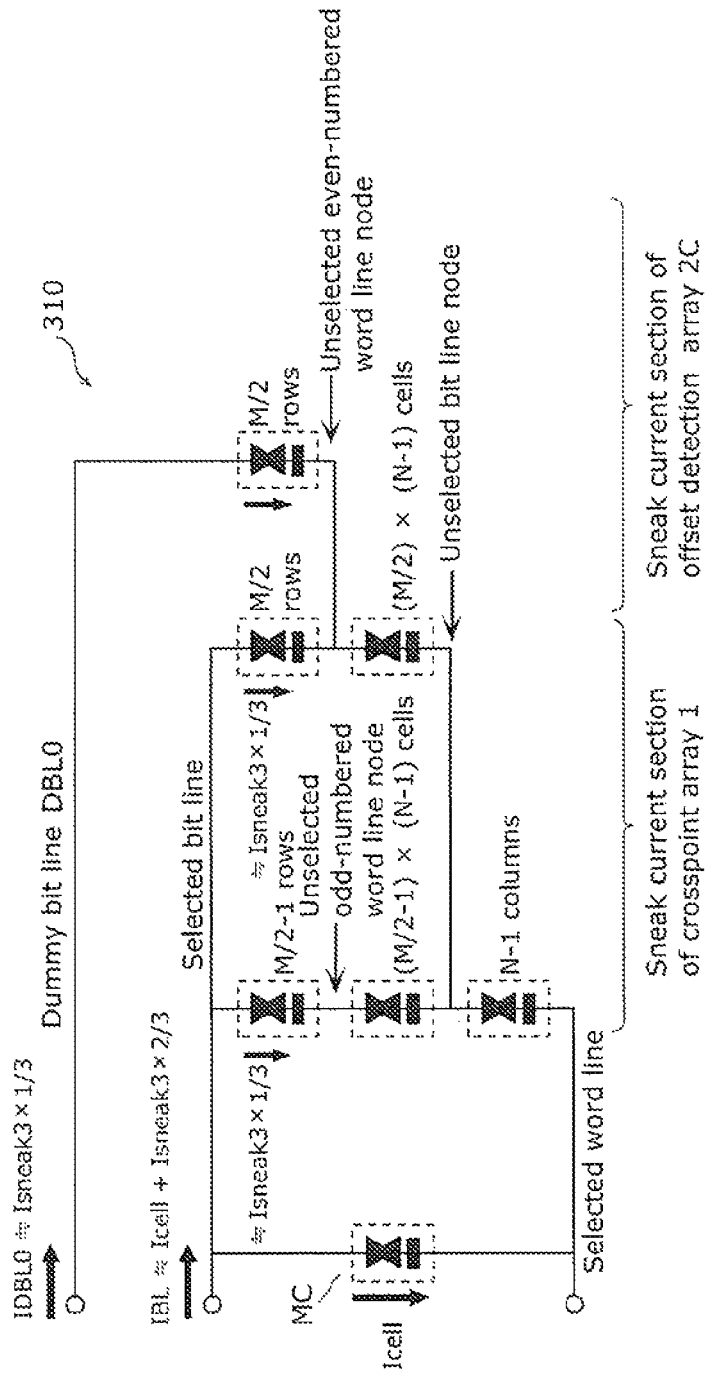
FIG. 13 is an equivalent circuit diagram of a cross-point cell array block according to the second embodiment of the present invention.

FIG. 13 is a simplified equivalent circuit diagram illustrating the impedance of the cross-point cell array block 310 included in the nonvolatile semiconductor memory device 300 when the memory cell MC located at the three-dimensional cross-point area A is selected. The equivalent circuit of FIG. 13 differs from that of FIG. 9 only in that the dummy bit line is a single line. There is only one sneak current path from the dummy bit line DBL0 to even-numbered word lines (unselected even-numbered word line nodes), and thus the sneak current thereof is approximately ⅓ of the entire sneak current.

Therefore, under the assumption that Icell is the current which flows through the selected memory cell, Isneak3 is the sneak current of the entire system, and IDBL is the current which flows through the dummy bit line, current IBL which flows from the selected bit line of the cross-point cell array block 310 to the selected word line, and current IDBL which flows from the dummy bit line to the selected word line can be generally expressed as follows.

Input current IBL of the first current mirror circuit (=the current which flows out to the cross-point cell array 1) is given by $$IBL = I\text{cell} + I\text{sneak}3 \times 2/3$$

Input current IDBL of the second current mirror circuit (=the current which flows through the offset detection cell array 2C) is given by $$IDBL = I\text{sneak}3 \times 1/3$$

Consequently, the mirror current generated by the first current mirror circuit (mirror ratio: 1) is given by $$IBL = I\text{cell} + I\text{sneak}3 \times 2/3 \qquad \text{(Expression 5)}$$

On the other hand, the mirror current generated by the second current mirror circuit (mirror ratio: 2) is given by $$I\text{sneak}3 \times 1/3 \times 2.$$

Therefore, the summed current of the current generated by the third current mirror circuit (mirror ratio: 1) and the current which flows through the high resistance state reference cell 106a is given by Icell(HR)+Isneak3×2/3(Icell(HR) indicates the memory cell current in a high resistance state)

On the other hand, the summed current of the current generated by the fourth current mirror circuit (mirror ratio; 1) and the current which flows through the low resistance state reference cell 108a is given by Icell(LR)+Isneak3×2/3(cell(LR) indicates the memory cell current in a low resistance state)

Therefore, the mirror current generated by the fifth current mirror circuit (mirror ratio: 1/2) is given by Icell(HR)×1/2+Isneak3×1/3

On the other hand, the mirror current generated by the sixth current mirror circuit (mirror ratio: 1/2) is given by Icell×(LR)×1/2+Isneak3×1/3.

Then the summed current of the current generated by the fifth current mirror circuit and the current generated by the sixth current mirror circuit is given by {Icell(HR)+Icell(LR)}×1/2+Isneak3×2/3     (Expression 6)

Thus, while the input to the first input terminal is (the voltage corresponding to Icell+Isneak3×2/3), the input to the second input terminal, which is the reference level input of the comparator 110 has the sneak current component which is converted to the same current amount (Isneak3×2/3) as above, and only the memory cell current component is converted to the intermediate current ({Icell(HR)+Icell (LR)}×1/2) between the memory cell current in a high resistance state and the memory cell current in a low resistance state.

Therefore, the same sneak current component is inputted to both the first input terminal and the second input terminal of the comparator 110 as an offset, and the current which flows through only the selected memory cell is compared with the reference value (the average current of the current which flows through the memory cell when the memory cell is in a high resistance state, and the current which flows through the memory cell when the memory cell is in a low resistance state). Consequently, accurate reading independent of the sneak current is achieved.

In generalized terms, the relationship between the sneak current which flows through the first cross-point cell array (the cross-point cell array 1 in the present embodiment) and the magnitude of sneak current which flows through the second cross-point cell array (the offset detection cell array 2 in the present embodiment) can be expressed as follows.

It is assumed that the first cross-point cell array is a memory cell array with M rows and N columns, defined by M word lines and N bit lines, A pieces of the first type cell (normal memory cell) are disposed on each dummy bit line of the second cross-point cell array, and B pieces of the dummy bit line are simultaneously selected.

Under the assumption that Isneak is the total sneak current which flows through the selected word line, IBL is the absolute value of the sneak current flowing from the selected bit line, and IDBL is the absolute value of the sneak current flowing from the dummy bit lines of the second cross-point cell array, the current IBL and current IDBL are given as follows.

$IBL=(M-1)/(M-1+A \times B) \times I\text{sneak}$ $IDBL=A \times B/(M-1+A \times B) \times I\text{sneak}$ Here, IBL includes Icell, however, in order to focus on the sneak current included in IBL, Icell is not included in the above expression for the sake of convenience.

Because the present invention assumes a massive memory capacity, M>>1. Thus, the following expressions are obtained.

$IBL=M/(M+A \times B) \times I\text{sneak}$     (Expression 7)

$IDBL=A \times B/(M+A \times B) \times I\text{sneak}$     (Expression 8)

From Expressions 7 and 8, $X=IBL/IDBL=M/(A \times B)$     (Expression 9)

That is to say, for the selected word line which is the current outflow portion in common when observed from the cross-point cell array 1 and the offset detection cell array 2C, the sneak current can be distributed with the ratio (the cross-point cell-array 1: M pieces, the offset detection cell array 2: A×B pieces) of the number of memory cells on the selected bit line and the dummy bit lines which are the current inflow portion.

For instance, in the above-described example in FIG. 12, A=0.5□M, B=1. Thus, the following expressions are obtained.

$IBL=2/3 \times I\text{sneak}$ $IDBL=1/3 \times I\text{sneak}$

This result is derived from the assumption that the mirror ratio X of the second current mirror circuit is 2 in FIG. 12.

Even when a configuration other than the offset detection cell array 2C is adopted, the mirror ratio of the second current mirror circuit to the first current mirror circuit may be determined based on the ratio calculated by Expressions 7 and 8.

In the example of FIG. 2, A=M−1, B=1, Thus, the following expressions are obtained.

$IBL=1/2 \times I\text{sneak}$ $IDBL=1/2 \times I\text{sneak}$

In the example of FIG. 8, A=0.5×M, B=2. Thus, the following expressions are obtained.

$IBL=1/2 \times I\text{sneak}$ $IDBL=1/2 \times I\text{sneak}$

These are theoretical expressions, and when put into practical applications, it is needless to say that a variety of variations should be taken into consideration for design. Generally, for example, a margin of ±20% is provided for design. In the example of FIG. 12, the size of the P-type MOS transistor 102b corresponding to the mirror ratio 2 of the second current mirror circuit 102 is optimized in a range of 1.6 to 2.4 Wp.

That is to say, the mirror ratio X of the second current mirror circuit 102 in a practical design is optimized in a range of $0.8 \times M/(A \times B) \leq X \leq 1.2 \times M/(A \times B)$.

As described above, in the present embodiment, the reference level of the comparator 110 is automatically set in conjunction with the magnitude of the sneak current component, and thus a stable read circuit can be achieved even with a variation in the switching element. 12.

In addition, because the sneak current component observed from the memory cell current detection circuit 101 can be reduced to ⅔, increase of S/N can be achieved at the same time.

In the case where the memory cell current in a high resistance state is negligible, the high resistance state reference cell 106a does not need to be disposed. Alternatively, the high resistance reference current generation circuit 103 itself may not be disposed, and the mirror ratio of the fourth current mirror circuit may be adjusted and doubled.

Figure 14:
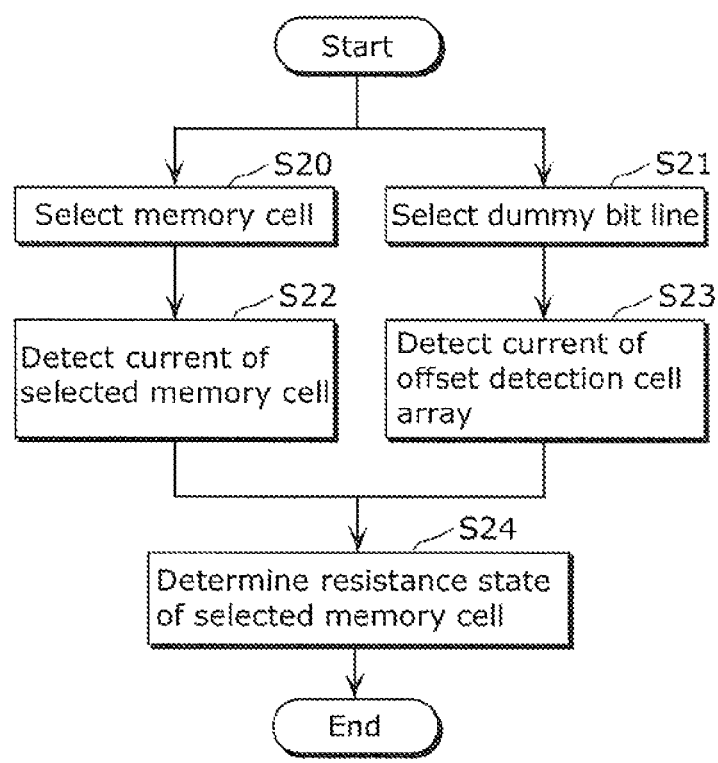
FIG. 14 is a flowchart illustrating a read method performed by the nonvolatile semiconductor memory device according to the second embodiment of the present invention.

The read operation described above is summarized in the steps of the flowchart illustrated in FIG. 14.

That is to say, in the read method performed by the nonvolatile semiconductor memory device 300 in the present embodiment, first, one word line is selected from a plurality of word lines WL0 to WL7 as a selected word line by the word line selection circuit 3, and one bit line is selected from a plurality of bit lines as a selected bit line by the bit line selection circuit 4 (memory cell selection step S20).

At the same time (concurrently), at least one dummy bit line is selected as a selected dummy bit line from one or more dummy bit lines by the dummy bit line selection circuit 5 (dummy bit line selection step S21). In dummy bit line selection step S21, the dummy bit line on which the second type cell (offset detection cell) is disposed at the three-dimensional cross-point of the selected word line and the selected dummy bit line is selected as a selected dummy bit line in a period of the read operation performed in the subsequent read step S22.

Subsequent to memory cell selection step S20, a predetermined voltage is applied to a selected memory cell by the is memory cell current detection circuit 101 via the selected word line and the selected bit line so as to detect the current which flows through the selected memory cell which is corresponding to the first type cell (memory cell) in a first cross-point cell array (cross-point cell array 1) (first current detection step S22).

Then concurrently with the above-described first current detection step S22 subsequent to dummy bit line selection step S21, i.e., in a period of current detection in first current detection step S22, the current which flows through the second cross-point cell array (the offset detection cell array 2) is detected by the offset current detection circuit 102 via the selected dummy bit line (second current detection step S23).

Finally, the comparator 110 compares a value corresponding to the current which flows through the selected memory cell with another value (reference level) based on the current which flows through the second cross-point cell array (the offset detection cell array 2), the value being detected in first current detection step S22, and the another value being detected in second current detection step S23, thereby determining a resistance state of the selected memory cell (resistance state determination step S24).

By such a read method, the reference level of the comparator 110 is automatically set in conjunction with the magnitude of the sneak current component, the reference level is compared with a value corresponding to the current which flows through the selected memory cell by the comparator 110, and thus a resistance state of the select memory cell is determined. Consequently, stable reading is performed irrespective of the preset resistance value of the switching element. 12 in the memory cell.

[Third Embodiment]

Figure 15:
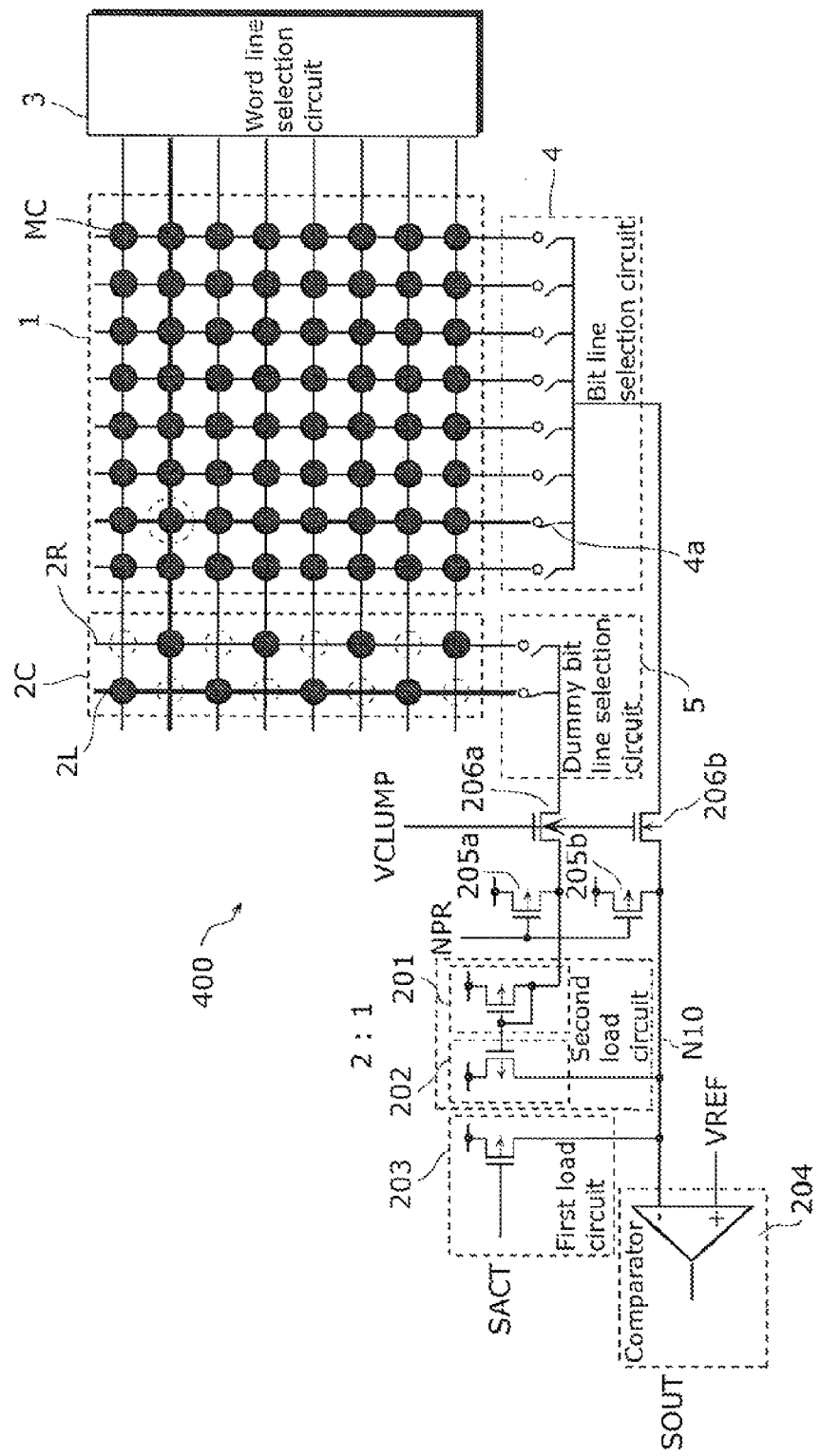
FIG. 15 is a schematic circuit diagram of a nonvolatile semiconductor memory device according to a third embodiment of the present invention.

FIG. 15 is a circuit diagram of a nonvolatile semiconductor memory device 400 according to a third embodiment of the present invention. The nonvolatile semiconductor memory device 400 provides a feedback to the read circuit of the cross-point cell array 1 according to the magnitude of a current which flows through the dummy bit lines. That is to say, the nonvolatile semiconductor memory device 400 includes a first load circuit (P-type MOS transistor 203), and a second load circuit (a current mirror circuit comprising a P-type MOS transistor 201 and a P-type MOS transistor 202) as a read circuit, and further includes a circuit which supplies a current from the second load circuit, the current being obtained by amplifying the current detected by the current detection circuit (an N-type MOS transistor 206a) by a predetermined factor, generates a voltage by the first load circuit, the voltage (voltage at node N10) corresponding to a difference between the supplied current and the current which flows through the selected bit line, and determines the resistance state of the selected cell by comparing the generated voltage with a predetermined reference voltage (VREF).

Hereinafter, the components of the nonvolatile semiconductor memory device 400 will be described in detail.

Because the cross-point cell array 1 and the offset detection cell array 2C are the same as those in FIG. 12, description thereof is omitted.

The output of the dummy bit line selection circuit 5 for the offset detection cell array 2C is connected to a P-type MOS transistor 205a and a P-type MOS transistor 201 via an N-type MOS transistor 206a, which serves as a current detection circuit for the offset detection cell arrays 2C.

On the other hand, the output of the bit line selection circuit 4 for the cross-point cell array 1 is connected to a P-type MOS transistor 205b, a P-type MOS transistor 202, a P-type MOS transistor 203, and a first input terminal of a comparator 204 via an N-type MOS transistor 206b, which serves as a current detection circuit for the cross-point cell array 1, the comparator 204 comparing a voltage at a second input terminal with a predetermined potential VREF.

A voltage VCLUMP is concurrently applied to the gates of the N-type MOS transistor 206a and the N-type MOS transistor 206b. Thus, the N-type MOS transistor 206a and the N-type MOS transistor 206b serve as a clamp which prevents the voltage of the bit lines and the dummy bit lines from increasing up to a predetermined voltage or higher.

The gates of the N-type MOS transistor 206a and the N-type MOS transistor 206b are connected to a signal NPR for issuing a precharge command. Thus, the N-type MOS transistor 206a and the N-type MOS transistor 206b precharge (applies a voltage to) a bit line and a dummy bit line for a predetermined period before a read operation.

The P-type MOS transistor 201 and the P-type MOS transistor 202 constitute a current mirror circuit (a second load circuit) having a mirror ratio of 1:2, and the P-type MOS transistor 202 supplies a predetermined number of times (here twice) as much current as the sneak current which flows through the dummy bit line, i.e., a current comparable to the sneak current which flows into the cross-point cell array 1.

The P-type MOS transistor 203 serves as a load circuit (a first load circuit) for reading a memory cell current. The P-type-MOS transistor 203 is kept on in an activation command period by a sense amplifier activation signal SACT which is inputted to the gate thereof. Consequently, the voltage at node N10 converges to a voltage which is determined by a ratio of the current which flows through the P-type MOS transistor 203 to the current which flows through the selected memory cell. In this case, the sneak current of the cross-point cell array 1 is compensated by current mirror circuits (the P-type MOS transistor 201 and the P-type MOS transistor 202), and thus the current to be supplied by the P-type MOS transistor 203 as a load circuit may be adjusted by only considering that the sneak current component should be neglected, and the amount of current which flows through the memory cell when the memory cell is at an intermediate level between a high resistance state and a low resistance state is to be achieved.

Thus, according to the nonvolatile semiconductor memory device 400 in the present embodiment, a voltage (voltage at node N10) determined depending on the net memory cell current with the sneak current component removed is compared with a predetermined potential VREF by the comparator 204, and thus reading is performed with a high S/N.

Application examples of the nonvolatile semiconductor memory device according to the present invention include the following.

Figure 16:
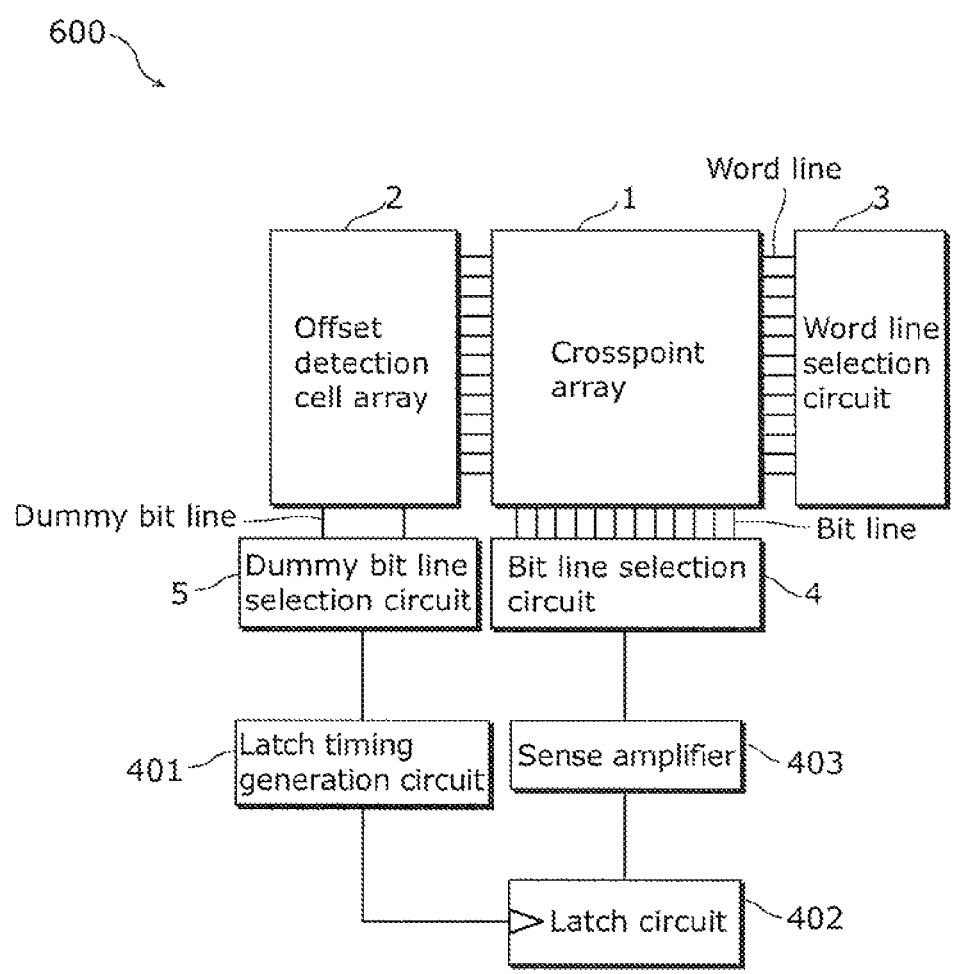
FIG. 16 is a schematic circuit block diagram of a nonvolatile semiconductor memory device according to a fourth embodiment of the present invention.

FIG. 16 is a block diagram illustrating the circuit configuration of a nonvolatile semiconductor memory device 600 according to a fourth embodiment of the present invention. A feature of the nonvolatile semiconductor memory device 600 is that it observes the magnitude of current which flows through a dummy bit line in terms of a discharge delay time of the dummy bit line. The nonvolatile semiconductor memory device 600 includes the cross-point cell array 1, the offset detection cell array 2, the word line selection circuit 3, the bit line selection circuit 4, the dummy bit line selection circuit 5, a latch timing generation circuit 401, a latch circuit 402, and a sense amplifier 403. In the nonvolatile semiconductor memory device 600, a current detection circuit (here, the latch timing generation circuit 401) for the offset detection cell array 2 generates a timing signal having a timing which is determined by a discharge time depending on the current which flaws through the dummy bit line, and a read circuit (here, the sense amplifier 403, the latch circuit 402) latches data which indicates the resistance state of the selected memory cell based on the timing signal.

Hereinafter, the components of the nonvolatile semiconductor memory device 600 will be described in detail.

The components of the nonvolatile semiconductor memory device 600 generates a latch timing signal by the latch timing generation circuit 401 utilizing a discharge characteristic which depends on the amount of current which flows through the dummy bit lines. For example, a latch timing signal is generated by discharging a precharged charge of a capacitor with the current which flows through the dummy bit line.

The latch circuit 402 latches the output (that is to say, data indicating the resistance state of the selected memory cell) of the sense amplifier 403 in synchronization with the latch timing signal.

Consequently, data can be read from the memory cell in a timing reflecting the current which flows through the dummy bit line, i.e., the amount of sneak current, and thus stable reading can be achieved. In addition, reading speed is increased to a level higher than that of a read method having a fixed delay time.

Figure 17:
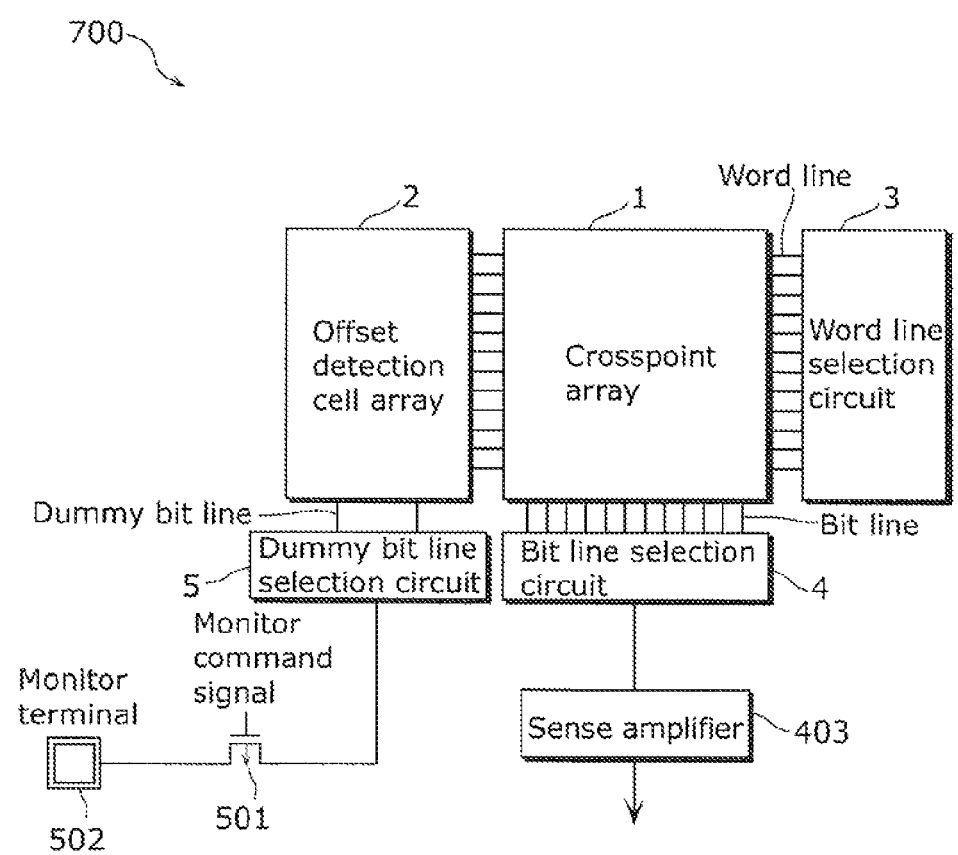
FIG. 17 is a schematic circuit block diagram of a nonvolatile semiconductor memory device according to a fifth embodiment of the present invention.
Figure 18:
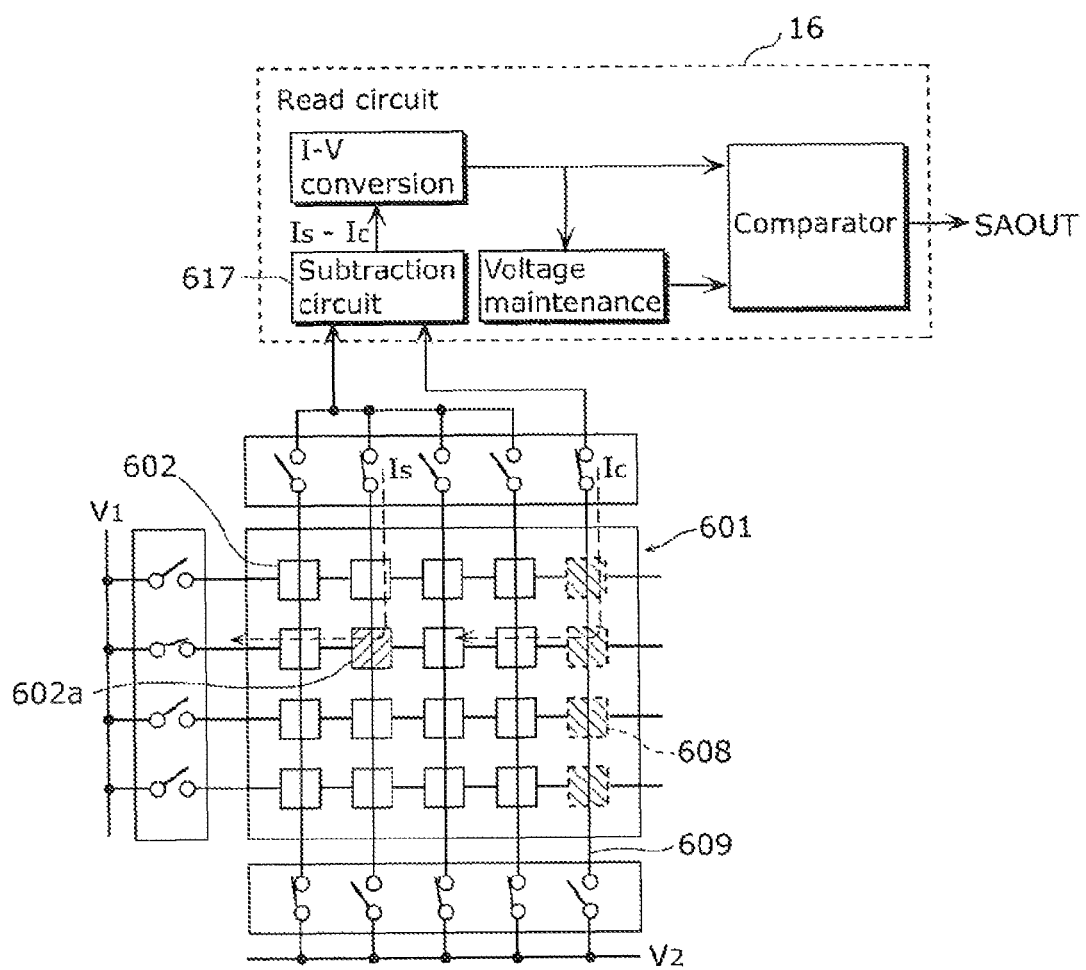
FIG. 18 is a schematic diagram of a conventional onvolatile semiconductor memory device.

FIG. 17 is a block diagram illustrating the circuit configuration of a nonvolatile semiconductor memory device 700 in a fifth embodiment of the present invention. A feature of the nonvolatile semiconductor memory device 700 is that it includes a monitor terminal 502 which is connected to the dummy bit line, and allows probing from the outside of the nonvolatile semiconductor memory device 700, the dummy bit line being selected by the dummy bit line selection circuit 5.

More particularly, the nonvolatile semiconductor memory device 700 has a configuration in which wiring is connected to the monitor terminal 502 from the dummy bit line selection circuit 5 for the offset detection cell array 2 via a switching device comprising the N-type MOS transistor 501.

Consequently, a sneak current can be directly measured by the monitor terminal 502. It is essential to reduce the sneak current for stabilization of yield and the operation in a cross point nonvolatile semiconductor memory device, and the nonvolatile semiconductor memory device 700 in the present embodiment provides an effective method for directly evaluating off characteristics of the switching element. 12

In the above, the nonvolatile semiconductor memory device and the read method thereof according to the present invention have been described based on the embodiments, however, the present invention is not limited to these embodiments and modifications. In a scope not departing from the gist of the present invention, modifications to which various changes that occur to those skilled in the art are made, and an embodiment which is implemented in any combination of the components of the embodiments and modifications are also included in the scope of the present invention.

For example, each of the nonvolatile semiconductor memory devices in the above-described embodiments may include any of the offset detection cell arrays illustrated in (a) to (c) in FIG. 4. That is to say, the present invention is not limited to the above-described configurations of the number of dummy bit lines, and the number, arrangement, and the like of memory cells and offset detection cells as long as the cross-point cell array comprises cells, either one of a memory cell and an offset detection cell located at each of three-dimensional cross-points of a plurality of word lines and dummy bit lines, and each dummy bit line including at least one of each of the memory cell and the offset detection cell.

In the above-described embodiments, the word lines are shared by the cross-point cell array and the offset detection cell array, however, the bit lines may be shared by the cross-point cell array and the offset detection cell array instead. That is to say, the word line and the bit line in the above-described embodiments are the designations of respective wires for defining the row and column of each cell array, and thus the present invention is valid even when the word line and the bit line are replaced with each other.

Additionally, a configuration may be adopted in which an independent offset detection cell array which is not shared by any word or bit line may be provided, and a monitor terminal similar to that of the nonvolatile semiconductor memory device 700 described in the fifth embodiment, for example, and an offset current detection circuit may be provided, so that the sneak current of the offset detection cell array is measured independently. In this case, the sneak current of the selected bit line path described by Expression 1 is not reduced as an effect, however, an effect resulting from directly measuring the sneak current amount indicated by Expression 2 can be obtained similarly. For example, the resistance states of the memory cells in the offset detection cell array are set in a low resistance state, and the sneak current of the offset detection cell array is pre-measured before the cross-point array is read, so that the measurement result is reflected on reading of the cross-point array. In this manner, even when the ambient temperature changes, or sneak currents vary with lots and slices due to variation in manufacturing conditions, stable read operation can be performed.

In the nonvolatile semiconductor memory device in the above-described embodiments, a write circuit for the memory cells and a circuit which performs forming operation have not been clearly shown. However, it is needless to say that those circuits may be provided.

[Industrial Applicability]

In order to implement particularly a cross-point structure which allows memory devices to be more finely structured and to have a larger capacity in a nonvolatile semiconductor memory device, there used to be a problem that SN ratio of a read command signal is reduced due to a sneak current, and the problem is difficult to be solved by the conventional device configuration. The present invention provides a nonvolatile semiconductor memory device which can solve the above-mentioned problem, and is useful for application to various electronic devices such as a digital home appliance, a memory card, a cellular phone, and a personal computer.

REFERENCE SIGNS LIST

1 Cross-point cell array
2, 2A to 2E Offset detection cell array
3 Word line selection circuit
4 Bit line selection circuit
5 Dummy bit line selection circuit
6 Current source
6a, 101a, 101b, 102a, 102b, 105a, 107a, 109a, 109b, 201 to 203, 205a, 205b P-type MOS transistor
7, 403 Sense amplifier
8, 9 Clamp circuit
11 Variable resistance element 12 Switching element
100, 210, 310 Cross-point cell array block
101 Memory cell current detection circuit
101c Constant current source
102 Offset current detection circuit
102c, 105b, 107b, 206a, 206b, 501 N-type MOS transistor
103 High resistance reference current generation circuit
104 Low resistance reference current generation circuit
105 Offset current regenerative circuit
106 High resistance cell current generation circuit
106a High resistance state reference cell
107 Offset current regenerative circuit
108 Low resistance cell current generation circuit
108a Low resistance state reference cell
109 Reference level generation circuit
109c Constant current source
110, 204 Comparator
200, 300, 400, 600, 700 Nonvolatile semiconductor memory device
401 Latch timing generation circuit
402 Latch circuit
502 Monitor terminal
800 Interlayer insulating
810 First via
811 Memory element
812 Second via
901 Interlayer insulating film
911 First electrode
912 Second electrode
913 Third electrode
921 High oxygen-deficient layer
922 Low oxygen-deficient layer
930 Semiconductor layer
970 Variable resistance element
971 Diode
972 Memory element
MC Memory cell
DMC Offset detection cell

The invention claimed is:

1. A nonvolatile semiconductor memory device, comprising:
word lines formed in parallel in a first plane;
bit lines formed in parallel in a second plane and three-dimensionally crossing the word lines, the second plane being parallel to the first plane;
a first cross-point cell array including first type cells located at three-dimensional cross-points of the word lines and the bit lines;
one or more dummy bit lines formed in parallel and three-dimensionally crossing the word lines in the second plane;
a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines;
a word line selection circuit that selects one of the word lines as a selected word line;
a bit line selection circuit that selects one of the bit lines as a selected bit line;
a dummy bit line selection circuit that selects at least one of the one or more dummy bit lines as a selected dummy bit line;
a read circuit that applies a predetermined voltage via the selected word line and the selected bit line to a selected cell which is a corresponding first type cell in the first cross-point cell array, and determines a resistance state of the selected cell based on a current which flows through the selected bit line; and
a current source that supplies a current to the second cross-point cell array via the selected dummy bit line in a period of a read operation performed by the read circuit,
wherein the first type cell includes a variable resistance element that operates as a memory by reversibly changing between at least two resistance states based on an electrical signal applied between a corresponding one of the word lines and a corresponding one of the bit lines,
the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is a state of the variable resistance element when operating as the memory, and
the dummy bit line selection circuit selects, as the selected dummy bit line, a dummy bit line such that the second type cell is disposed at a three-dimensional cross-point of the selected dummy bit line and the selected word line, in a period of a read operation performed by the read circuit.

2. A nonvolatile semiconductor memory device, comprising:
word lines formed in parallel in a first plane;
bit lines formed in parallel in a second plane and three-dimensionally crossing the word lines, the second plane being parallel to the first plane;
a first cross-point cell array including one or more first type cells located at three-dimensional cross-points of the word lines and the bit lines;
one or more dummy bit lines formed in parallel and three-dimensionally crossing the word lines in the second plane;
a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines;
a word line selection circuit that selects one of the word lines as a selected word line;
a bit line selection circuit that selects one of the bit lines as a selected bit line;
a dummy bit line selection circuit that selects at least one of the one or more dummy bit lines as a selected dummy bit line;
a read circuit that applies a predetermined voltage via the selected word line and the selected bit line to a selected cell which is a corresponding first type cell in the first cross-point cell array, and determines a resistance state of the selected cell based on a current which flows through the selected bit line; and
a current detection circuit that detects a current which flows through the second cross-point cell array via the selected dummy bit line in a period of a read operation performed by the read circuit,
wherein the first type cell includes a variable resistance element that operates as a memory by reversibly changing between at least two resistance states based on an electrical signal applied between a corresponding one of the word lines and a corresponding one of the bit lines, the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is a state of the variable resistance element when operating as the memory, the dummy bit line selection circuit selects a dummy bit line as the selected dummy bit line such that the second type cell is disposed at a three-dimensional cross-point of the selected dummy bit line and the selected word line, in a period of a read operation performed by the read circuit, and the read circuit determines a resistance state of the selected cell based on a value corresponding to the current which flows through the selected bit line, and a value according to the current which flows through the second cross-point cell array and is detected by the current detection circuit.

3. The nonvolatile semiconductor memory device according to claim 2, further comprising:
a first current summing circuit that generates a first summed current which is a sum of (i) a current flowing through a reference cell which includes the first type cell and is set in a first resistance state out of the at least two resistance states, and (ii) a current obtained by amplifying the current detected by the current detection circuit by X times; and
a second current summing circuit that generates a second summed current which is a sum of a current and another current, the current flowing through a reference cell which includes the first type cell and is set in a second resistance state out of the at least two resistance states, and the another current being obtained by amplifying the current detected by the current detection circuit by X times,
wherein the read circuit determines the resistance state based on a criterion with a value of a reference level which is an average of the first summed current and the second summed current.

4. The nonvolatile semiconductor memory device according to claim 2,
wherein the read circuit includes a first load circuit and a second load circuit, supplies from the second load circuit a current obtained by amplifying the current detected by the current detection circuit by a predetermined factor, generates a voltage corresponding to a difference between the supplied current and the current which flows through the selected bit line, by the first load circuit, and determines the resistance state of the selected cell by comparing the generated voltage with a predetermined reference voltage.

5. The nonvolatile semiconductor memory device according to claim 2,
wherein the current detection circuit generates a timing signal having a timing determined by a discharge time which depends on the current, and latches data indicating the resistance state based on the timing signal.

6. The nonvolatile semiconductor memory device according to claim 2, further comprising
a monitor terminal which is connected to the dummy bit line selected by the dummy bit line selection circuit, and which allows probing from an outside of the nonvolatile semiconductor memory device.

7. The nonvolatile semiconductor memory device according to claim 1,
wherein the first type cell disposed in the second cross-point cell array is set in a resistance state which is a lower resistance state out of the at least two resistance states.

8. The nonvolatile semiconductor memory device according to claim 1,
wherein a current Isneak is distributed to the selected bit line and the one or more dummy bit lines with a ratio of IBL:IDBL=M:A×B
where the first cross-point cell array is a cell array with M rows and N columns, defined by M word lines and N bit lines, A (a natural number such that 1≤A≤M−1) pieces of the first type cell are disposed on each of the one or more dummy bit lines of the second cross-point cell array, B (a natural number such that 1≤B≤N) pieces of dummy bit line are simultaneously selected by the dummy bit line selection circuit, Isneak is a total of sneak current which flows through the selected word line, IBL is an absolute value of a sneak current flowing from the selected bit line, and IDBL is an absolute value of a sneak current flowing from the one or more dummy bit lines.

9. The nonvolatile semiconductor memory device according to claim 3,
wherein the X satisfies 0.8×M/(A×B)≤X≤1.2×M/(A×B)
where the first cross-point cell array is a cell array with M rows and N columns, defined by M word lines and N bit lines, A (a natural number such that 1≤A≤M−1) pieces of the first type cell are disposed on each of the one or more dummy bit lines of the second cross-point cell array, and B (a natural number such that 1≤B≤N) pieces of dummy bit line are simultaneously selected by the dummy bit line selection circuit.

10. A method of reading data from a first type cell in a nonvolatile semiconductor memory device which includes:
word lines formed in parallel in a first plane;
bit lines formed in parallel in a second plane three-dimensionally crossing the word lines, the second plane being parallel to the first plane;
a first cross-point cell array including one or more first type cells located at three-dimensional cross-points of the word lines and the bit lines;
one or more dummy bit lines formed in parallel and three-dimensionally crossing the word lines in the second plane;
a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines;
the first type cell includes a variable resistance element that operates as a memory by reversibly changing between at least two resistance states based on an electrical signal applied between a corresponding one of the word lines and a corresponding one of the bit lines; and
the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is assumed by the variable resistance element when operating as the memory, the method comprising:

selecting one of the word lines as a selected word line, and selecting one of the bit lines as a selected bit line;

selecting at least one of the one or more dummy bit lines as a selected dummy bit;

applying a predetermined voltage via the selected word line and the selected bit line to a selected cell which is a corresponding first type cell in the first cross-point cell array, and determining a resistance state of the selected cell based on a current which flows through the selected bit line; and supplying a current to the second cross-point cell array via the selected dummy bit line in a period of a read operation performed in the applying, wherein in the selecting at least one of the one or more dummy bit lines, selecting, as the selected dummy bit line, a dummy bit line such that the second type cell is disposed at a three-dimensional cross-point of the dummy bit line and the selected word line, in a period of a read operation performed in the applying.

11. A method of reading data from a first type cell in a nonvolatile semiconductor memory device which includes:

word lines formed in parallel in a first plane;

bit lines formed in parallel in a second plane and three-dimensionally crossing the word lines, the second plane being parallel to the first plane;

a first cross-point cell array including first type cells located at three-dimensional cross-points of the word lines and the bit lines;

one or more dummy bit lines formed in parallel and three-dimensionally crossing the word lines in the second plane;

a second cross-point cell array including cells, each of which is either the first type cell or a second type cell, located at a corresponding one of three-dimensional cross-points of the word lines and the one or more dummy bit lines, the second cross-point cell array including at least one each of the first type cells and the second type cells for each of the one or more dummy bit lines;

the first type cell includes a variable resistance element that operates as a memory by reversibly changing between at least two resistance states based on an electrical signal applied between a corresponding one of the word lines and a corresponding one of the bit lines; and the second type cell includes an offset detection cell having a resistance value that is, irrespective of an electrical signal applied between a corresponding one of the word lines and a corresponding one of the one or more dummy bit lines, higher than the resistance value of the variable resistance element in a high resistance state which is assumed by the variable resistance element when operating as the memory, the method comprising:

selecting one of the word lines as a selected word line, and selecting one of the bit lines as a selected bit line;

selecting at least one of the one or more dummy bit lines as a selected dummy bit;

applying a predetermined voltage via the selected word line and the selected bit line to a selected cell which is a corresponding first type cell in the first cross-point cell array, and detecting a current which flows through the selected bit line;

detecting a current which flows through the second cross-point cell array via the selected dummy bit line in a period of a current detection performed in the applying; and determining a resistance state of the selected cell based on a value corresponding to the current which flows through the selected bit line and is detected in the applying, and a value according to the current which flows through the second cross-point cell array and is detected in the detecting, wherein in the selecting at least one of the one or more dummy bit lines, selecting, as the selected dummy bit line, a dummy bit line such that the second type cell is disposed at a three-dimensional cross-point of the dummy bit line and the selected word line, in a period of a current detection performed in the applying.

12. The nonvolatile semiconductor memory device according to claim 2, wherein the first type cell disposed in the second cross-point cell array is set in a resistance state which is a lower resistance state out of the at least two resistance states.

13. The nonvolatile semiconductor memory device according to claim 2, wherein a current Isneak is distributed to the selected bit line and the one or more dummy bit lines with a ratio of IBL:IDBL=M:A×B where the first cross-point cell array is a cell array with M rows and N columns, defined by M word lines and N bit lines, A (a natural number such that $1 \leq A \leq M-1$) pieces of the first type cell are disposed on each of the one or more dummy bit lines of the second cross-point cell array, B (a natural number such that $1 \leq B \leq N$) pieces of dummy bit line are simultaneously selected by the dummy bit line selection circuit, Isneak is a total of sneak current which flows through the selected word line, IBL is an absolute value of a sneak current flowing from the selected bit line, and IDBL is an absolute value of a sneak current flowing from the one or more dummy bit lines.

* * * * *